(12) United States Patent
Chikamatsu et al.

(10) Patent No.: US 9,704,982 B2
(45) Date of Patent: Jul. 11, 2017

(54) SEMICONDUCTOR DEVICE WITH HIGH ELECTRON MOBILITY TRANSISTOR (HEMT) HAVING SOURCE FIELD PLATE

(71) Applicant: ROHM CO., LTD., Kyoto (JP)

(72) Inventors: Kentaro Chikamatsu, Kyoto (JP); Taketoshi Tanaka, Kyoto (JP); Minoru Akutsu, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/003,772

(22) Filed: Jan. 21, 2016

(65) Prior Publication Data

US 2016/0218203 A1    Jul. 28, 2016

(30) Foreign Application Priority Data

Jan. 22, 2015   (JP) ................................. 2015-010461

(51) Int. Cl.
*H01L 29/778* (2006.01)
*H01L 29/40* (2006.01)
*H01L 29/66* (2006.01)
*H01L 29/423* (2006.01)
*H01L 29/205* (2006.01)
*H01L 29/20* (2006.01)
(Continued)

(52) U.S. Cl.
CPC ........ *H01L 29/7786* (2013.01); *H01L 29/205* (2013.01); *H01L 29/402* (2013.01); *H01L 29/404* (2013.01); *H01L 29/66462* (2013.01); *H01L 29/2003* (2013.01); *H01L 29/41758* (2013.01); *H01L 29/4236* (2013.01); *H01L 29/513* (2013.01)

(58) Field of Classification Search
CPC ............... H01L 29/7786; H01L 29/402; H01L 29/66462; H01L 29/4236
See application file for complete search history.

(56) References Cited

U.S. PATENT DOCUMENTS

| | | | |
|---|---|---|---|
| 7,291,872 B2 * | 11/2007 | Hikita ................. | H01L 29/7787 257/192 |
| 2010/0283083 A1 * | 11/2010 | Niiyama ............. | H01L 29/7835 257/192 |
| 2014/0353720 A1 * | 12/2014 | Inoue .................. | H01L 29/7827 257/192 |

FOREIGN PATENT DOCUMENTS

JP   2007-537593 A   12/2007
JP   2008-124440 A    5/2008
(Continued)

*Primary Examiner* — Thanh V Pham
(74) *Attorney, Agent, or Firm* — Rabin & Berdo, P.C.

(57) ABSTRACT

A semiconductor device comprises a Group III nitride semiconductor lamination structure including a hetero-junction; an insulating layer formed on the Group III nitride semiconductor lamination structure, the insulating layer including a gate opening portion extending to the Group III nitride semiconductor lamination structure; a gate insulating film configured to cover a bottom portion and a side portion of the gate opening portion; a gate electrode formed on the gate insulating film in the gate opening portion; a source electrode and a drain electrode disposed in a spaced-apart relationship with the gate electrode to sandwich the gate electrode and electrically connected to the Group III nitride semiconductor lamination structure; and a conductive layer embedded in the insulating layer between the gate electrode and the drain electrode and insulated from the gate electrode by the gate insulating film, the conductive layer electrically connected to the source electrode.

16 Claims, 28 Drawing Sheets

(51) Int. Cl.
*H01L 29/417* (2006.01)
*H01L 29/51* (2006.01)

(56) References Cited

FOREIGN PATENT DOCUMENTS

JP    2008-131031 A    6/2008
WO    WO-2005/114744 A2    12/2005

* cited by examiner

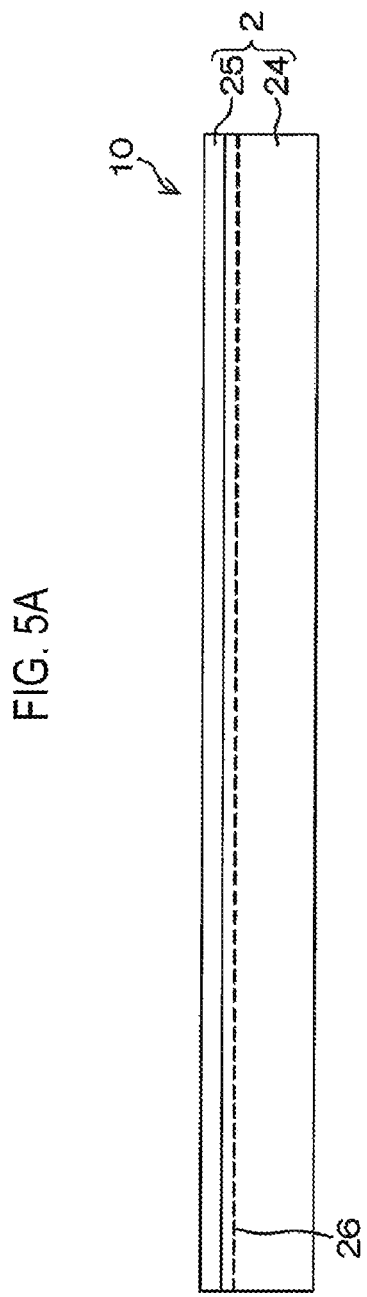

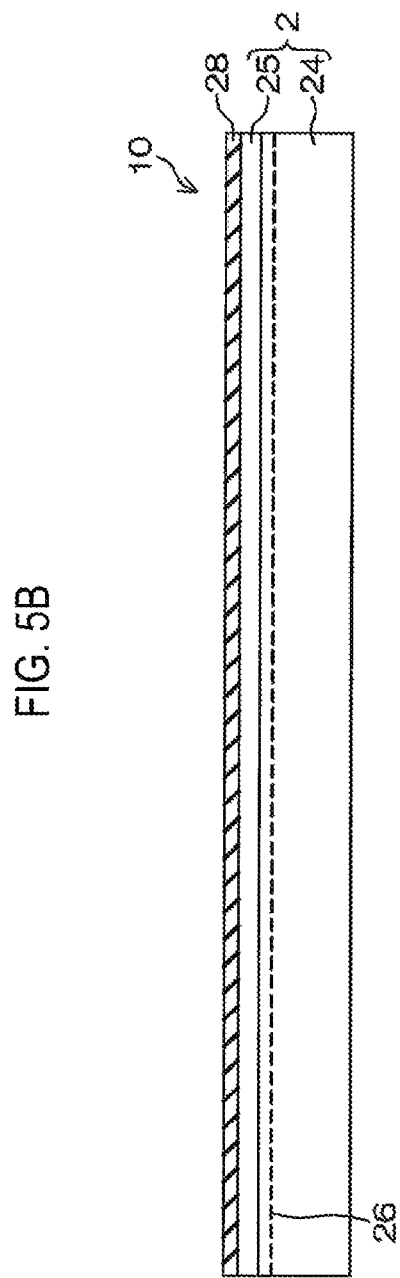

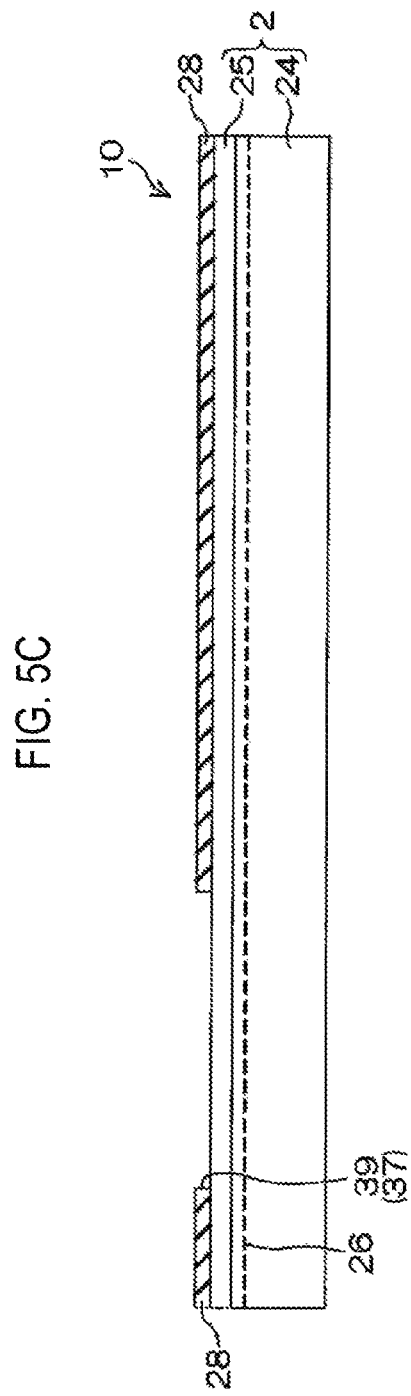

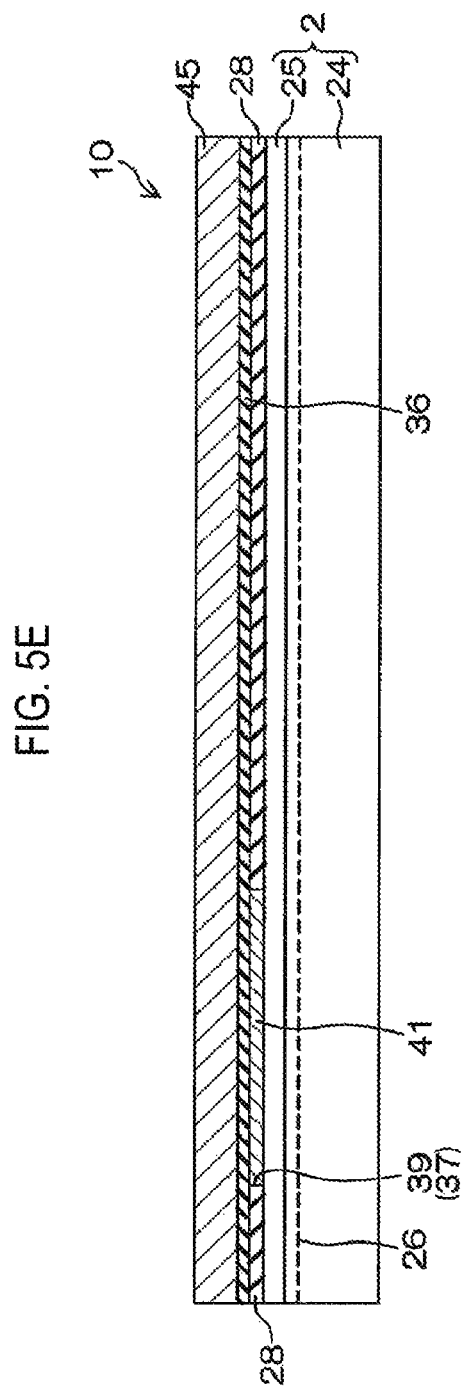

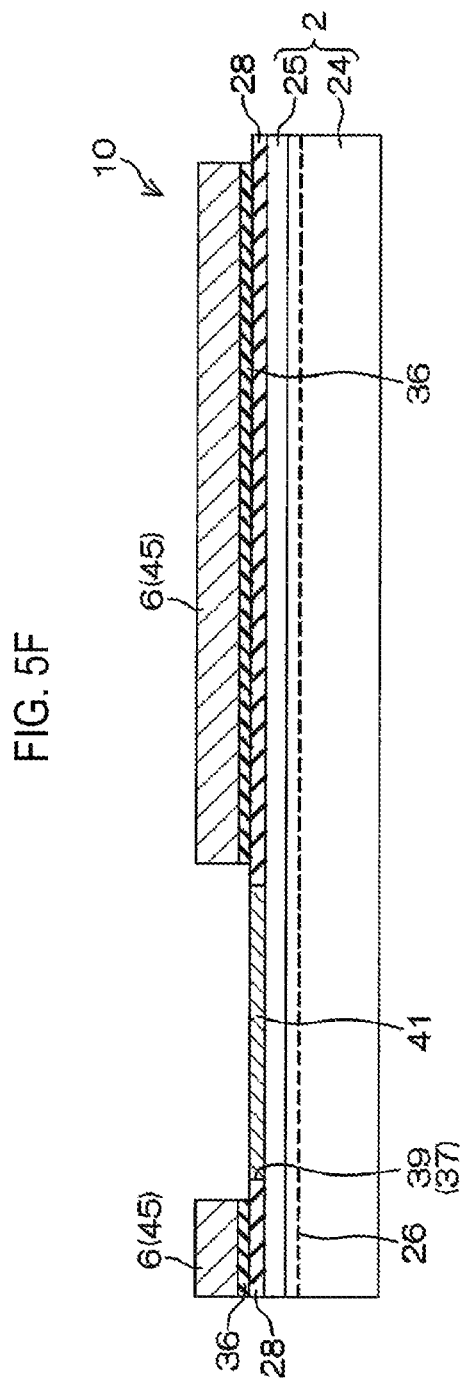

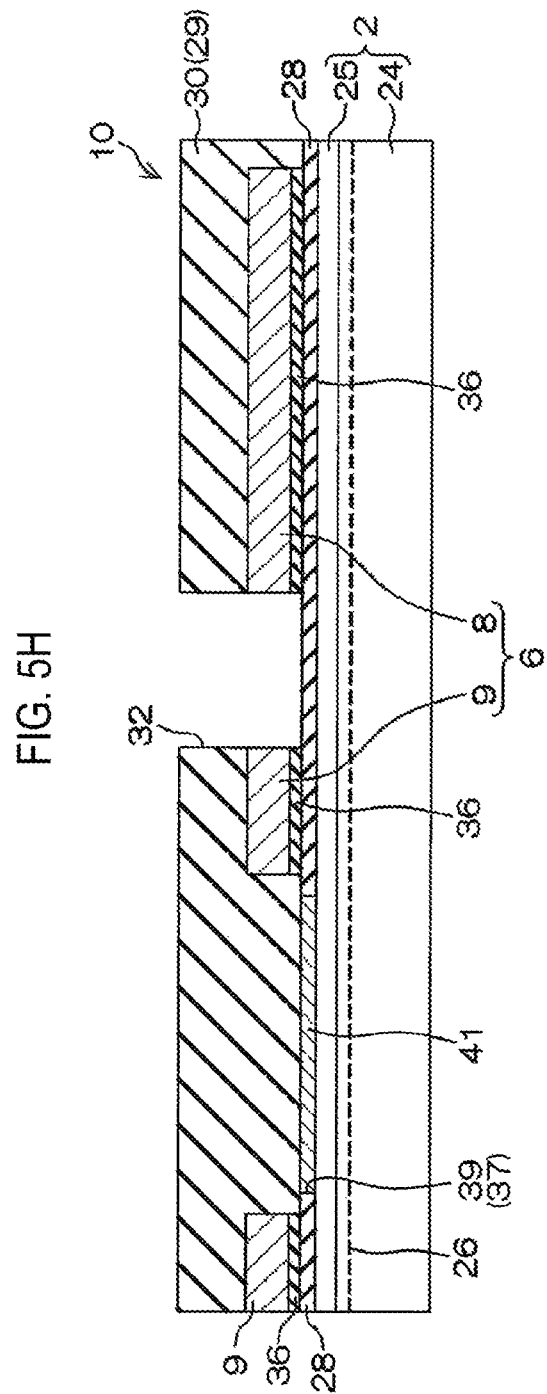

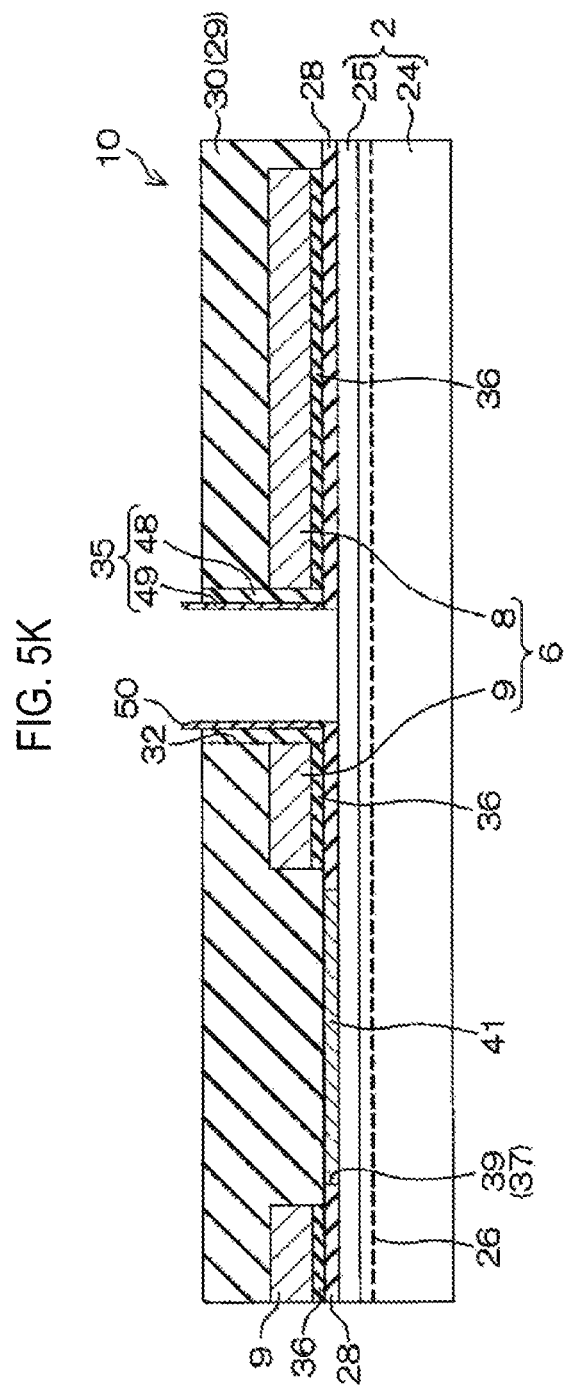

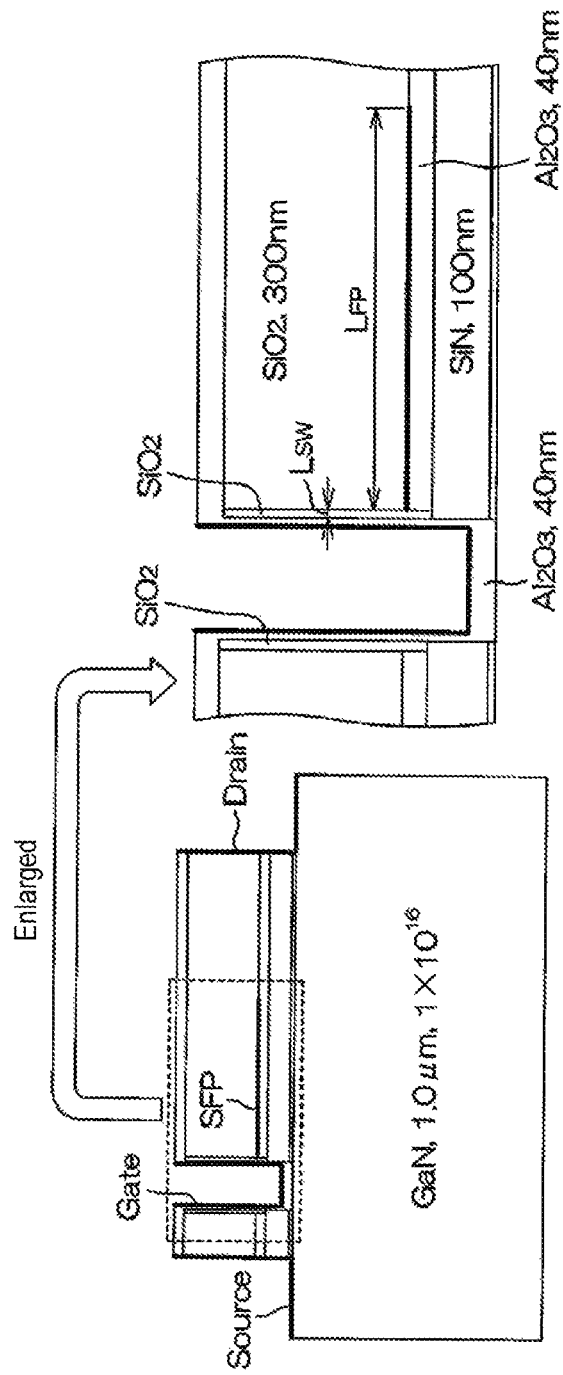

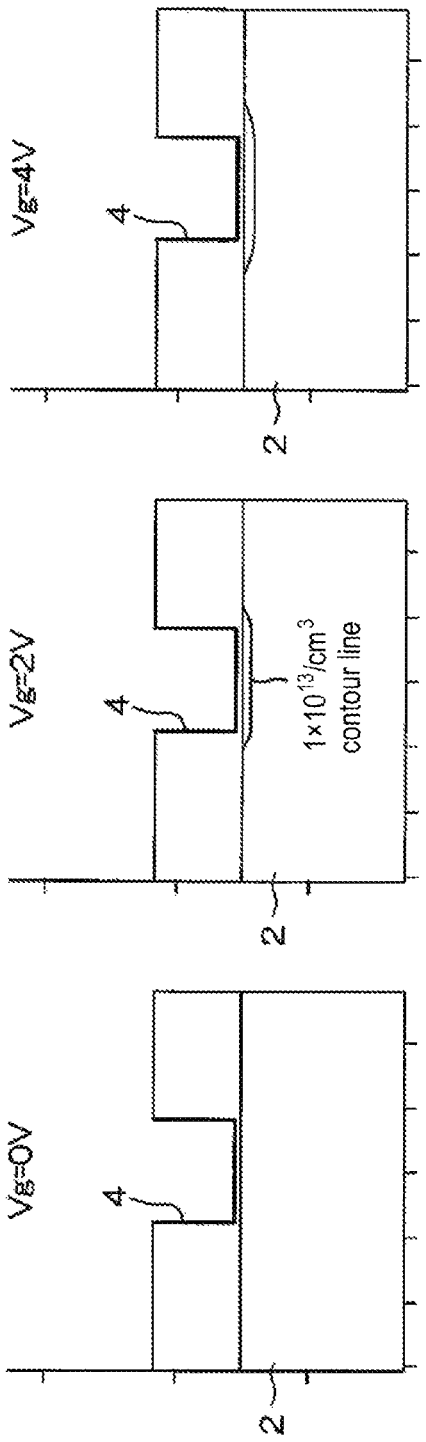

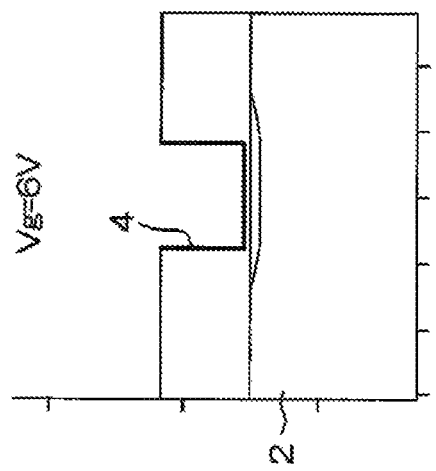
FIG. 10A Vg=6V
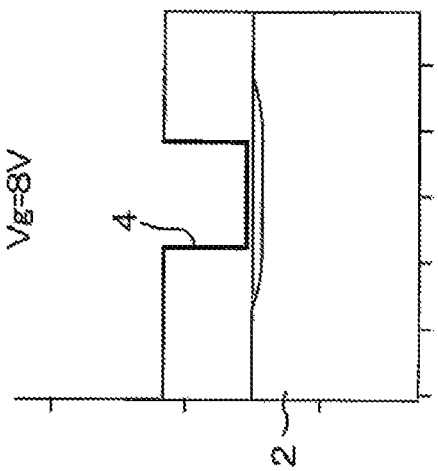
FIG. 10B Vg=8V
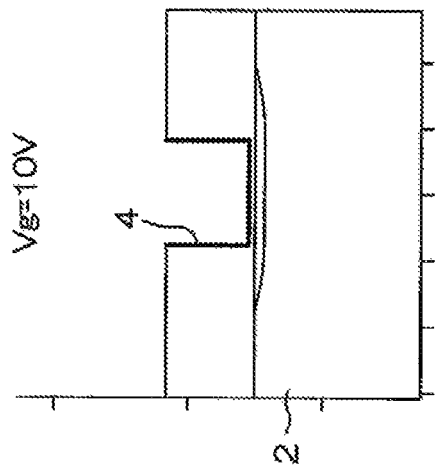
FIG. 10C Vg=10V

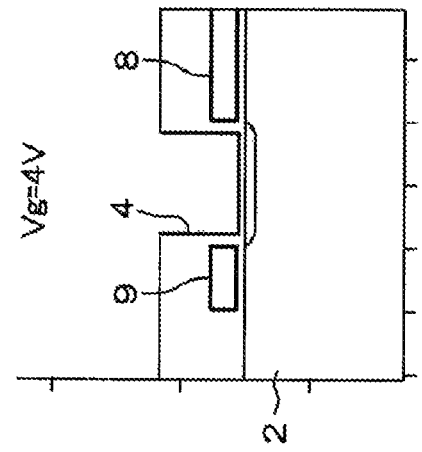
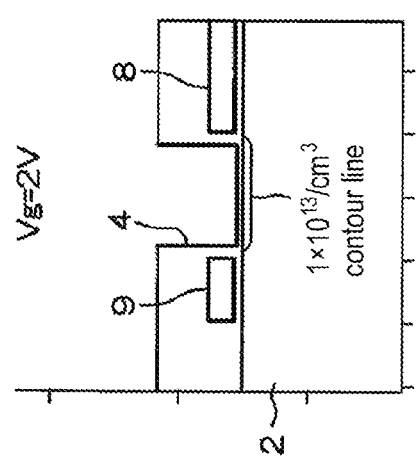
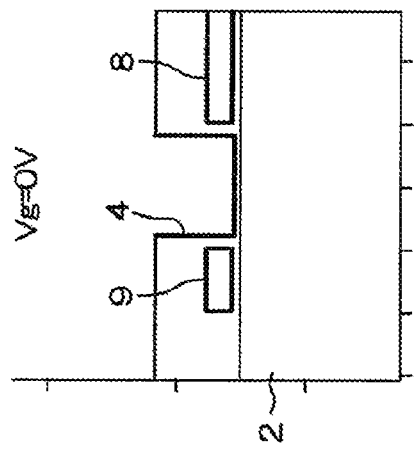

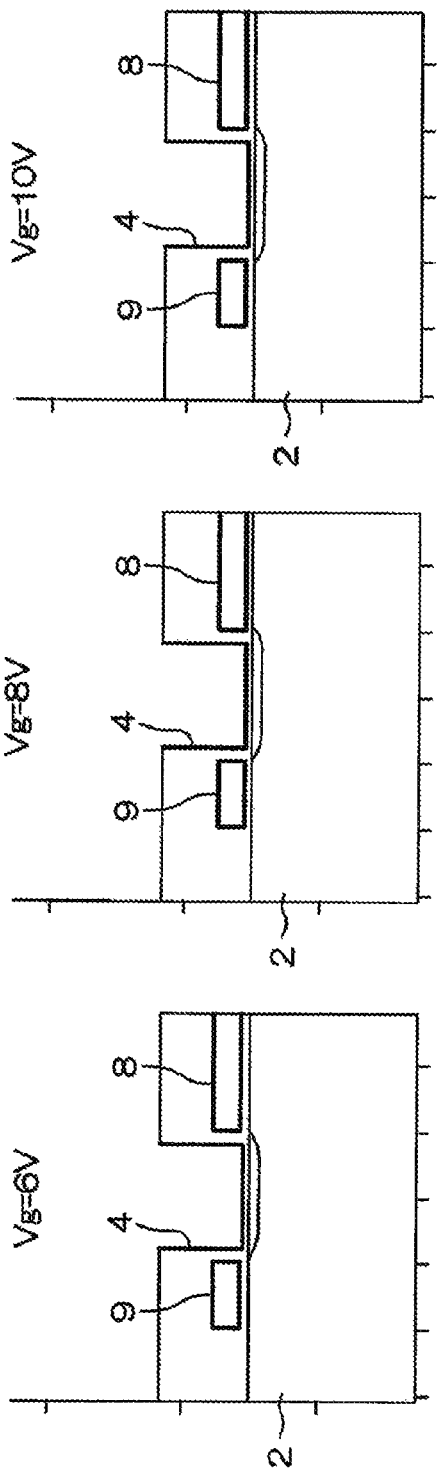

SEMICONDUCTOR DEVICE WITH HIGH ELECTRON MOBILITY TRANSISTOR (HEMT) HAVING SOURCE FIELD PLATE

CROSS-REFERENCE TO RELATED APPLICATION

This application is based upon and claims the benefit of priority from Japanese Patent Application No. 2015-010461, filed on Jan. 22, 2015, the entire contents of which are incorporated herein by reference.

TECHNICAL FIELD

The present disclosure relates to a semiconductor device including a high electron mobility transistor (HEMT) and a method of manufacturing the same.

BACKGROUND

In a HEMT having a metal insulator semiconductor (MIS) structure, a gate field plate integral with a gate electrode is formed to relax electric field concentration on an end portion of the gate electrode. As another approach for relaxing electric field concentration, it has been proposed that a source field plate electrically connected to a source electrode is formed at a lateral side of a gate electrode.

SUMMARY

The present disclosure provides some embodiments of a semiconductor device capable of reducing a parasitic capacitance and relaxing electric field concentration on the respective ends of a gate electrode and a conductive layer (source field plate), and a method of manufacturing the same.

According to one embodiment of the present disclosure, there is provided a semiconductor device, including: a Group III nitride semiconductor lamination structure including a hetero-junction; an insulating layer formed on the Group III nitride semiconductor lamination structure, the insulating layer including a gate opening portion extending to the Group III nitride semiconductor lamination structure; a gate insulating film configured to cover a bottom portion and a side portion of the gate opening portion; a gate electrode formed on the gate insulating film in the gate opening portion; a source electrode and a drain electrode disposed in a spaced-apart relationship with the gate electrode to sandwich the gate electrode and electrically connected to the Group III nitride semiconductor lamination structure; and a conductive layer embedded in the insulating layer between the gate electrode and the drain electrode and insulated from the gate electrode by the gate insulating film, the conductive layer electrically connected to the source electrode.

According to another embodiment of the present disclosure, there is provided a semiconductor device, including: a Group III nitride semiconductor lamination structure including a hetero-junction; an insulating layer formed on the Group III nitride semiconductor lamination structure, the insulating layer including a gate opening portion extending to the Group III nitride semiconductor lamination structure; a gate insulating film configured to cover a bottom portion and a side portion of the gate opening portion; a gate electrode formed on the gate insulating film in the gate opening portion; a source electrode and a drain electrode disposed in a spaced-apart relationship with the gate electrode to sandwich the gate electrode and electrically connected to the Group III nitride semiconductor lamination structure; and a source field plate embedded in the insulating layer to partially form the side portion of the gate opening portion between the gate electrode and the drain electrode and insulated from the gate electrode by the gate insulating film, the source field plate electrically connected to the source electrode.

These semiconductor devices can be manufactured by, for example, a method according to a further embodiment of the present disclosure, including: forming a conductive layer on a Group III nitride semiconductor lamination structure including a hetero-junction; forming an insulating layer to cover the conductive layer; forming a gate opening portion by etching the insulating layer and the conductive layer from an etching region including a region facing toward at least a portion of the conductive layer, and exposing the conductive layer to a side portion of the gate opening portion; forming a gate insulating film to cover a bottom portion and the side portion of the gate opening portion; forming a gate electrode on the gate insulating film in the gate opening portion; forming a drain electrode on the Group III nitride semiconductor lamination structure to sandwich the conductive layer between the drain electrode and the gate electrode; and forming a source electrode at an opposite side of the drain electrode with the gate electrode sandwiched between the source electrode and the drain electrode.

According to this method, the conductive layer (the source field plate) is formed through a self-alignment process when forming the gate opening portion. It is therefore possible to fix the end portion of the conductive layer (the source field plate) that is close to the gate electrode to the side portion of the gate opening portion. Therefore, the distance between the gate electrode and the conductive layer (the source field plate) can be easily controlled by the thickness of the gate insulating film. As a result, it is possible to design the maximum field intensity in the semiconductor device at an intended value. Accordingly, it is possible to realize a structure capable of relaxing electric field concentration on the respective end portions of the gate electrode and the conductive layer (the source field plate).

In the semiconductor device thus obtained, the conductive layer (the source field plate) electrically connected to the source electrode is disposed between the gate electrode and the drain electrode. Thus, it is not necessary to install a gate field plate integrally and transversely extending from the gate electrode on the insulating layer. It is therefore possible to reduce a gate-drain coupling capacitance Cgd. As a result, it is possible to reduce the parasitic capacitance of the semiconductor device; and this makes it possible to reliably perform a high-speed switching operation, a high-frequency operation and the like, which are features of a nitride semiconductor-based device.

According to a further embodiment of the present disclosure, the semiconductor device further includes: an insulating sidewall disposed between the gate insulating film and the side portion of the gate opening portion.

According to a further embodiment of the present disclosure, the semiconductor device further includes: an insulating sidewall formed in the side portion of the gate opening portion to make contact with the source field plate, wherein the gate insulating film is formed to cover the sidewall.

The configuration provided with the sidewall can be obtained by, for example, the method according to a further embodiment of the present disclosure, further including: prior to forming the gate insulating film, forming an insulating film to cover the bottom portion and the side portion of the gate opening portion and a surface of the insulating layer; and forming a sidewall in the side portion of the gate opening portion by selectively etching the insulating film on the bottom portion of the gate opening portion and the surface of the insulating layer.

According to this configuration, the distance between the gate electrode and the conductive layer can be controlled mainly by the thickness of the sidewall. Thus, it is possible to design the thickness of the gate insulating film mainly in conformity with an intended gate threshold value voltage.

The method according to a further embodiment of the present disclosure further includes: prior to forming the conductive layer, forming, on the Group III nitride semiconductor lamination structure, an underlying layer for insulating the conductive layer from the Group III nitride semiconductor lamination structure, wherein the forming the sidewall includes forming a sidewall, at least an outermost surface of which has an insulating material that has a smaller etching selectivity than the underlying layer, and after forming the sidewall, selectively etching the underlying layer of the bottom portion of the gate opening portion such that the bottom portion of the gate opening portion extends to the Group III nitride semiconductor lamination structure.

According to this method, when etching the underlying layer, it is possible to restrain the sidewall from being etched together with the underlying layer and becoming thinner. Thus, even after etching the underlying layer, it is possible to maintain the sidewall having a thickness close to a designed value.

In the semiconductor device according to a further embodiment of the present disclosure, the sidewall includes at least one kind of material selected from a group consisting of $SiO_2$, SiN and SiON.

In the semiconductor device according to a further embodiment of the present disclosure, a distance $L_{GF}$ between the gate electrode and the conductive layer is 1 μm or less.

According to this configuration, the conductive layer is disposed relatively close to the gate electrode; and thus it is possible to reliably relax electric field concentration on the respective end portions of the conductive layer (the source field plate).

In the semiconductor device according to a further embodiment of the present disclosure, a length $L_{FP}$ of the conductive layer and a distance $L_{GD}$ between the gate electrode and the drain electrode satisfy an inequality of $L_{FP} < \frac{1}{3} L_{GD}$.

According to this configuration, the area of the conductive layer (the source field plate) is relatively small; and thus it is possible to suppress an increase of the drain-source coupling capacitance Cds attributable to the installation of the conductive layer.

In the semiconductor device according to a further embodiment of the present disclosure, the gate insulating film includes, as a constituent element, at least one kind of material selected from a group consisting of Si, Al and Hf.

In the semiconductor device according to a further embodiment of the present disclosure, the gate electrode includes a metal electrode.

In the semiconductor device according to a further embodiment of the present disclosure, the gate electrode includes an overlap portion formed on the gate insulating film at a peripheral edge of the gate opening portion.

In the semiconductor device according to a further embodiment of the present disclosure, the Group III nitride semiconductor lamination structure includes an active region including an element structure formed by sandwiching the gate electrode with the source electrode and the drain electrode and a non-active region other than the active region, each of the source electrode and the conductive layer includes an extension portion extending to the non-active region, and the extension portion of the source electrode and the extension portion of the conductive layer are connected to each other.

According to this configuration, it is not necessary to install, in the active region, a conductive structure electrically connected to each of the source electrode and the conductive layer across the upper side of the gate electrode, as a structure for electrically interconnecting the source electrode and the conductive layer (the source field plate). When installed in the active region, the conductive structure may become a cause of increasing the parasitic capacitance of the semiconductor device; however, by interconnecting the source electrode and the conductive layer in the non-active region as described above, it is possible to suppress an increase in the parasitic capacitance.

In the semiconductor device according to a further embodiment of the present disclosure, the Group III nitride semiconductor lamination structure includes a first semiconductor layer forming a hetero-junction and a second semiconductor layer formed on the first semiconductor layer, and the second semiconductor layer includes an oxide film selectively formed in the bottom portion of the gate opening portion by oxidizing the second semiconductor layer.

According to this configuration, it is possible to reduce the two-dimensional electron gas in a region immediately below the gate electrode; and this makes it possible to realize a normally-off-type HEMT.

In the semiconductor device according to a further embodiment of the present disclosure, the Group III nitride semiconductor lamination structure includes a first semiconductor layer forming a hetero-junction and a second semiconductor layer formed on the first semiconductor layer, and the second semiconductor layer is selectively etched only in the bottom portion of the gate opening portion.

According to this configuration, the formation of a hetero-junction in a region immediately below the gate electrode is prevented by a recess structure formed by etching. Thus, when a gate bias is not applied (during a zero bias time), the two-dimensional electron gas is not formed in the region immediately below the gate electrode; accordingly, it is possible to realize a normally-off-type HEMT.

The semiconductor device according to a further embodiment of the present disclosure further includes: an underlying layer that is disposed between the conductive layer and the Group III nitride semiconductor lamination structure and extends to formation regions of the source electrode and the drain electrode, wherein at least one of the source electrode and the drain electrode includes an ohmic electrode disposed in the underlying layer and a pad electrode in the insulating layer formed on the ohmic electrode.

In the semiconductor device according to a further embodiment of the present disclosure, the underlying layer has a thickness of 5 nm to 200 nm and the insulating layer has a thickness of 1.5 μm to 2 μm.

According to this configuration, the opening portion for an ohmic contact can be formed by etching the relatively thin underlying layer. Thus, when forming the opening portion, it is possible to reduce damage of the surface of the Group III nitride semiconductor lamination structure. Consequently, the source electrode and the drain electrode can be connected to the surface of the Group III nitride semiconductor lamination structure with reduced damage; and thus it is possible to obtain a good ohmic contact.

The semiconductor device according to a further embodiment of the present disclosure further includes: a second conductive layer embedded in the insulating layer between the gate electrode and the source electrode, the second conductive layer insulated from the gate electrode by the gate insulating film and also insulated from the source electrode.

BRIEF DESCRIPTION OF THE DRAWINGS

FIG. 5A is a view illustrating one step of a process of manufacturing the semiconductor device.

FIG. 5B is a view illustrating the next step of the step illustrated in FIG. 5A.

FIG. 5C is a view illustrating the next step of the step illustrated in FIG. 5B.

FIG. 5E is a view illustrating the next step of the step illustrated in FIG. 5D.

FIG. 5F is a view illustrating the next step of the step illustrated in FIG. 5E.

FIG. 5H is a view illustrating the next step of the step illustrated in FIG. 5G.

FIG. 5K is a view illustrating the next step of the step illustrated in FIG. 5J.

FIG. 5O is a view illustrating the next step of the step illustrated in FIG. 5N.

FIG. 6 is a diagram showing a simulation model.

FIGS. 9A to 9C are views illustrating the spread of a channel in the simulation model (without an SFP).

FIGS. 10A to 10C are views illustrating the spread of a channel in the simulation model (without an SFP).

FIGS. 11A to 11C are views illustrating the spread of a channel in the simulation model (with an SFP).

FIGS. 12A to 12C are views illustrating the spread of a channel in the simulation model (without an SFP).

DETAILED DESCRIPTION

An embodiment of the present disclosure will now be described in detail with reference to the accompanying drawings.

Figure 1A:
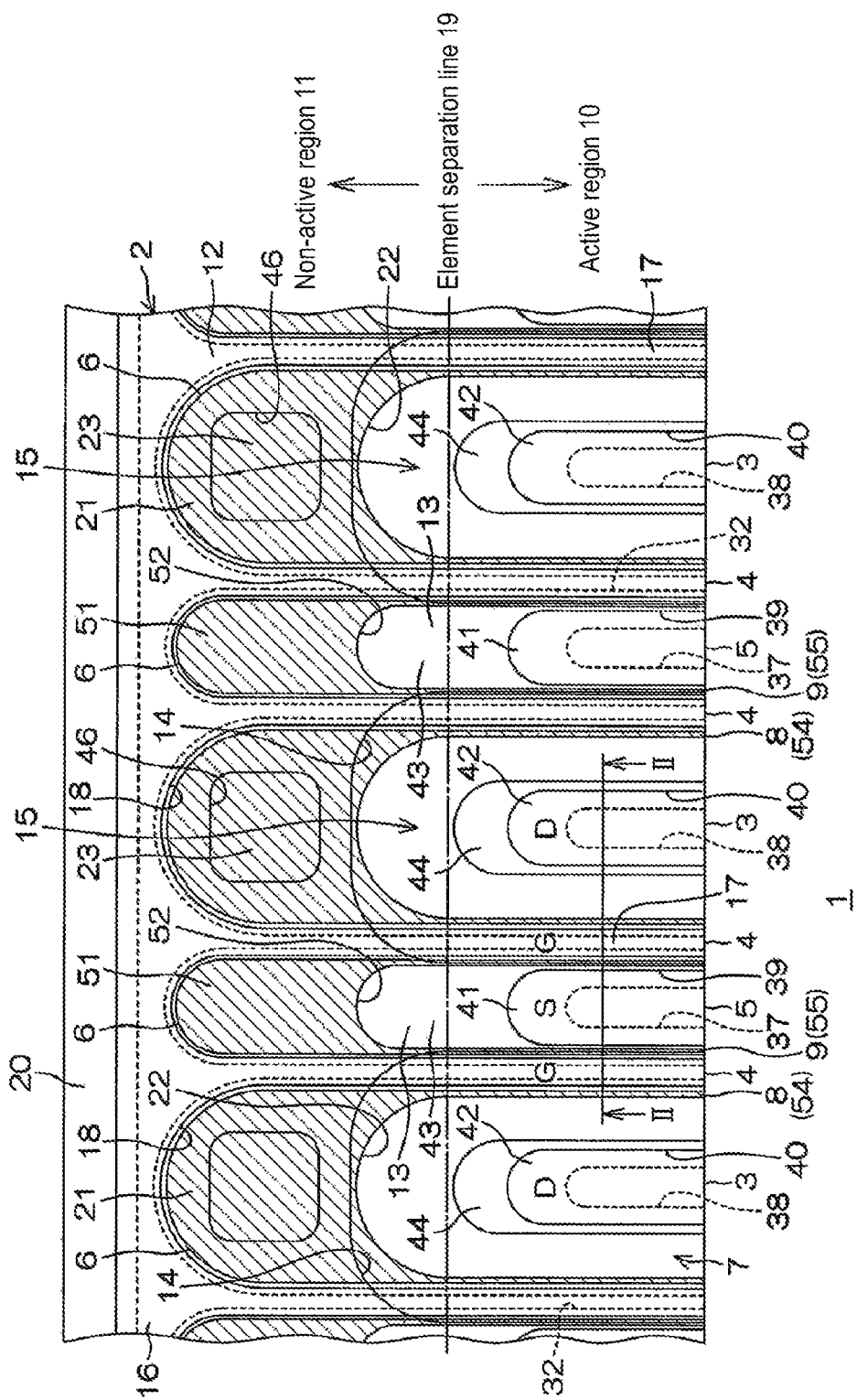
FIG. 1A is a schematic plane view of a semiconductor device according to one embodiment of the present disclosure.
Figure 1B:
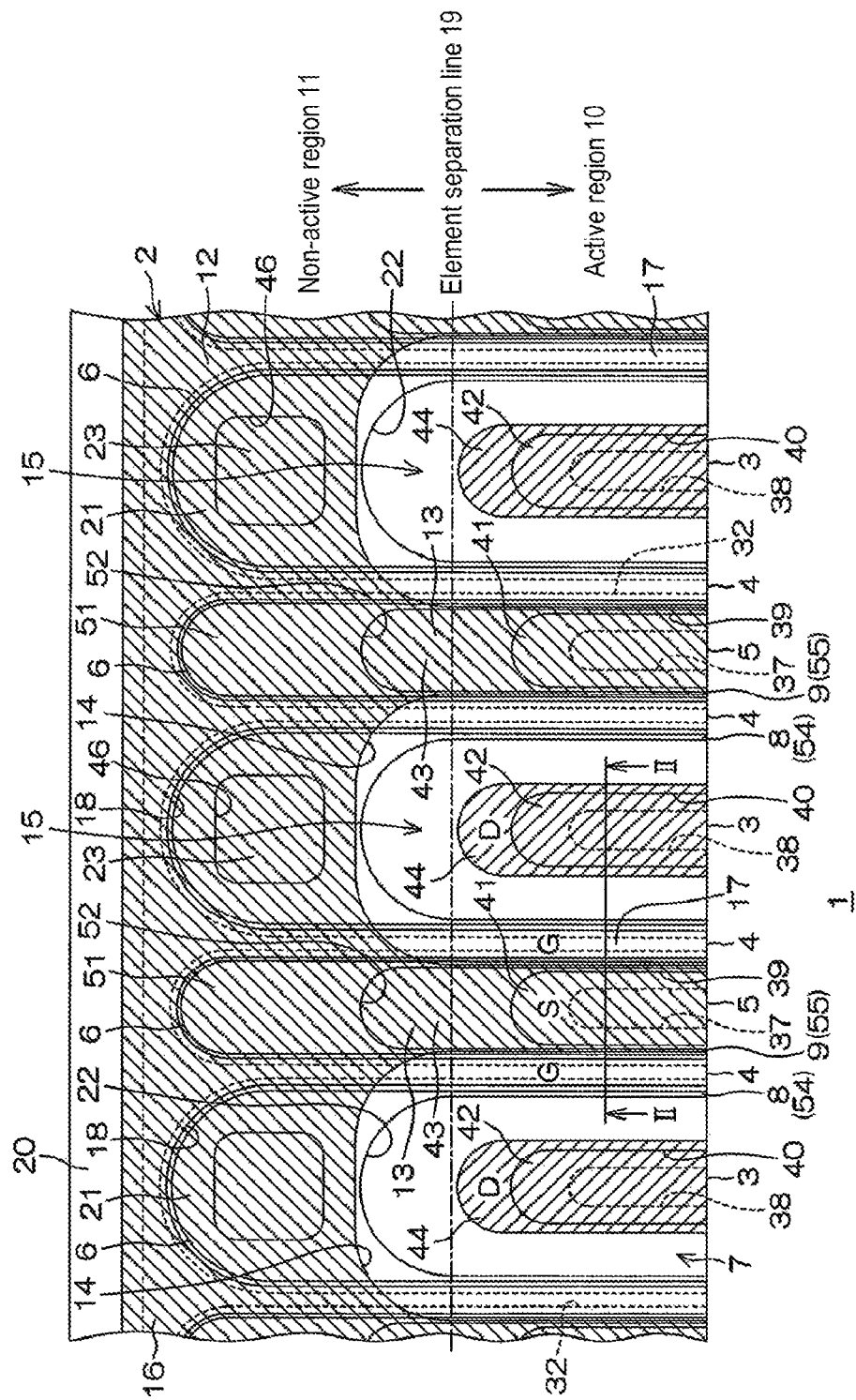
FIG. 1B is a schematic plane view of the semiconductor device according to one embodiment of the present disclosure.

FIGS. 1A and 1B are schematic plane views of a semiconductor device 1 according to one embodiment of the present disclosure. For the sake of clarity, the regions of a source field plate 8 and a floating plate 9 have hatching in FIG. 1A and the region of a source electrode 5 has hatching in FIG. 1B. FIGS. 1A and 1B remain the same except for the hatched regions.

The semiconductor device 1 includes a drain electrode 3, a gate electrode 4, a source electrode 5 and a plate film 6, which are formed on a Group III nitride semiconductor lamination structure 2 serving as a base. For example, as illustrated in FIGS. 1A and 1B, the drain electrode 3 (D), the gate electrode 4 (G) and the source electrode 5 (S) are periodically disposed in the order of DGSGD. Thus, an element structure 7 is configured by sandwiching the gate electrode 4 with the drain electrode 3 and the source electrode 5. The plate films 6 are respectively disposed between a gate and a source and between a drain and a gate. The source field plate 8 as one example of conductive layers of the present disclosure is disposed between the drain and the gate and the floating plate 9 as one example of second conductive layers of the present disclosure is disposed between the gate and the source.

An active region 10 including the element structure 7 and a non-active region 11 other than the active region 10 may be defined on the surface of the Group III nitride semiconductor lamination structure 2. The non-active region 11 may just adjoin the active region 10 as illustrated in FIGS. 1A and 1B or may surround the active region 10.

The source electrode 5 includes a base portion 12 as one example of an extension portion of the present disclosure formed on the non-active region 11 and a plurality of electrode portions 13 integrally connected to the base portion 12. The source electrode 5 of the present embodiment has a pectinate shape in which the plurality of electrode portions 13 extend in the form of mutually-parallel stripes. The base portion 12 includes connection end portions 14 for the electrode portions 13 formed within the non-active region 11. The plurality of electrode portions 13 extend from the connection end portions 14 toward the active region 10. That is to say, the plurality of electrode portions 13 span between the active region 10 and the non-active region 11.

A space 15 between the mutually-adjoining electrode portions 13 is a region in which the drain electrode 3 is disposed. By disposing the linear drain electrode 3 in the respective space 15, two pectinate shape source electrode 5 and drain electrode 3 engage with each other. While not shown in the drawings, in a similar manner as the source electrode 5, the drain electrode 3 may include a base portion formed on the non-active region 11 and a plurality of electrode portions (the portions disposed in the space 15) integrally connected to the base portion.

The gate electrode 4 includes a base portion 16 formed on the non-active region 11 and a plurality of electrode portions 17 integrally connected to the base portion 16. The gate electrode 4 of the present embodiment has a pectinate shape in which the plurality of electrode portions 17 extend in the form of mutually-parallel stripes. The base portion 16 includes connection end portions 18 for the electrode portions 17 within the non-active region 11. The connection end portions 18 are installed more outward than the connection end portions 14 of the source electrode 5 (at the side relatively farther from the active region 10) based on a boundary (element separation line 19) between the active region 10 and the non-active region 11. The plurality of electrode portions 17 extend from the connection end portions 18 toward the active region 10. That is to say, the plurality of electrode portions 17 span between the active region 10 and the non-active region 11. Furthermore, the base portion 16 of the gate electrode 4 includes a lead portion 20 positioned more outward than the base portion 12 of the source electrode 5. For example, the lead portion 20 is a region for forming a contact for the gate electrode 4.

The source field plate 8 includes a base portion 21 as one example of an extension portion of the present disclosure formed on the non-active region 11 and a plurality of electrode portions 54 integrally connected to the base portion 21. The source field plate 8 of the present embodiment has an arch shape in which a pair of electrode portions 54 extend from the opposite ends of the base portion 21. The base portion 21 includes connection end portions 22 for the electrode portions 54. The connection end portions 22 are installed substantially in the same position as the connection end portions 14 of the source electrode 5 based on the element separation line 19. The pair of electrode portions 54 extend from the respective connection end portions 22 toward the active region 10. That is to say, the pair of electrode portions 54 span between the active region 10 and the non-active region 11.

The base portion 12 of the source electrode 5 and the base portion 21 of the source field plate 8 partially overlap with each other within the non-active region 11. In this overlapping portion, the source electrode 5 and the source field plate 8 are connected to each other via a source contact 23. For example, as illustrated in FIGS. 1A and 1B, the source contact 23 is installed in such a position as to face the space 15 (in a position avoiding an extension portion of the electrode portions 13).

If the source contact 23 is installed in the non-active region 11 as described above, it is not necessary to install, in the active region 10, a conductive structure electrically connected to each of the source electrode 5 and the source field plate 8 across the upper side of the gate electrode 4, as a structure for electrically interconnecting the source electrode 5 and the source field plate 8. When installed in the active region 10, the conductive structure may become a cause of increasing the parasitic capacitance of the semiconductor device 1; however, by interconnecting the source electrode 5 and the source field plate 8 in the non-active region 11 as described above, it is possible to suppress an increase in the parasitic capacitance.

The floating plate 9 includes a base portion 51 formed on the non-active region 11 and a plurality of electrode portions 55 integrally connected to the base portion 51. The floating plate 9 of the present embodiment has an arch shape in which a pair of electrode portions 55 extend from the opposite ends of the base portion 51. The base portion 51 includes connection end portions 52 for the electrode portions 55 within the non-active region 11. The connection end portions 52 are installed substantially in the same position as the connection end portions 14 of the source electrode 5 based on the element separation line 19. The pair of electrode portions 55 extend from the connection end portions 52 toward the active region 10. That is to say, the pair of electrode portions 55 span between the active region 10 and the non-active region 11.

Next, the sectional structure of the semiconductor device 1 will be described mainly with reference to FIGS. 2 and 3.

Figure 2:
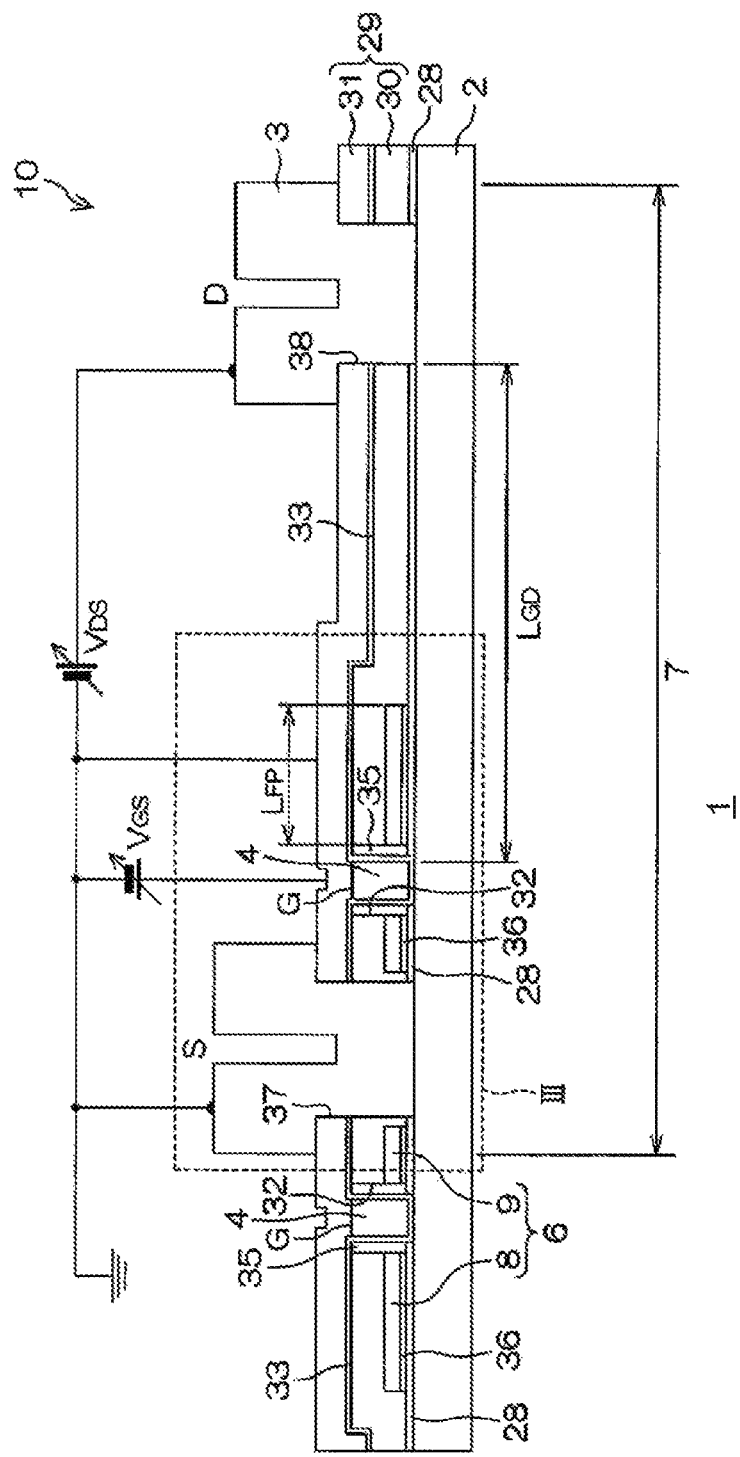
FIG. 2 is a sectional view of the semiconductor device (a sectional view taken along line II-II in FIGS. 1A and 1B).

FIG. 2 is a sectional view of the semiconductor device 1 (a sectional view taken along line II-II in FIGS. 1A and 1B). FIG. 3 is a partially enlarged view of the semiconductor device 1 (an inner region of broken line III in FIG. 2).

Figure 3:
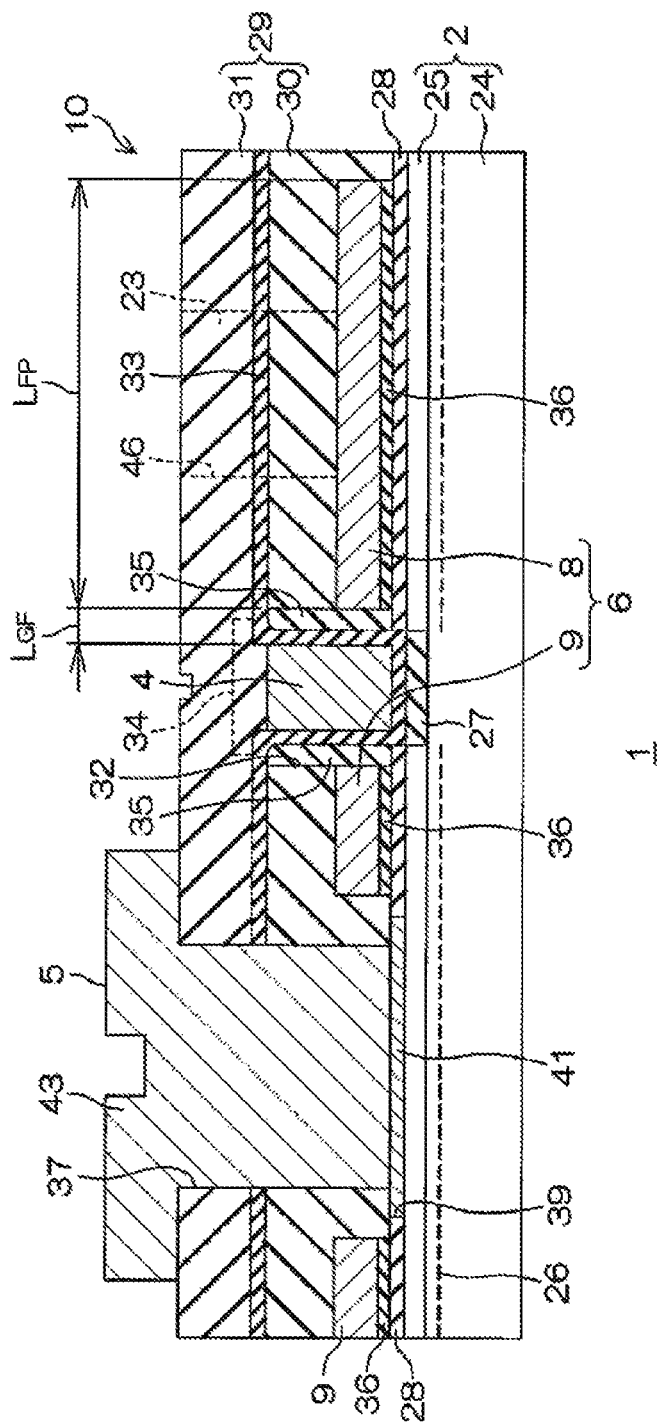
FIG. 3 is a partially enlarged view of the semiconductor device (an inner region of broken line III in FIG. 2).

As illustrated in FIG. 3, the Group III nitride semiconductor lamination structure 2 includes an electron channel layer 24 as one example of a first semiconductor layer of the present disclosure and an electron supply layer 25 as one example of a second semiconductor layer of the present disclosure formed on the electron channel layer 24. The electron channel layer 24 and the electron supply layer 25 are formed of Group III nitride semiconductors which differ in Al composition from each other. For example, the electron channel layer 24 may be formed of a GaN layer and the thickness of the electron channel layer 24 may be 0.1 μm to 3 μm. For example, the electron supply layer 25 may be formed of an AlN layer and the thickness of the electron supply layer 25 may be 1 nm to 7 nm. Further, the electron channel layer 24 and the electron supply layer 25 are not particularly limited as long as they have a composition capable of forming a hetero-junction to generate a two-dimensional electron gas. The electron channel layer 24 and the electron supply layer 25 may be formed of an $Al_xGa_{1-x}N$ layer (0≤x≤1) and an $Al_yGa_{1-y}N$ layer (0≤y≤1), respectively.

As described above, the electron channel layer 24 and the electron supply layer 25 are formed of nitride semiconductors differing in Al composition from each other; accordingly, a lattice mismatch may be generated between the electron channel layer 24 and the electron supply layer 25. Due to the polarization attributable to the lattice mismatch, a two-dimensional electron gas 26 attributable to the polarization is spread in a position close to an interface between the electron channel layer 24 and the electron supply layer 25 (e.g., a position spaced apart about several angstroms from the interface).

An oxide film 27 is selectively formed in the electron supply layer 25 to extend from the surface of the electron supply layer 25 to the electron channel layer 24. The oxide film 27 has a thickness substantially equal to the thickness of the electron supply layer 25. For example, the oxide film 27 is a thermal oxide film and the oxide film 27 is an oxide film which is formed without damaging an interface with the electron channel layer 24. In the case where the electron supply layer 25 is an AlN layer, the oxide film 27 may be formed of an AlON film.

Further, the Group III nitride semiconductor lamination structure 2 may be laminated on a substrate such as a silicon substrate or the like via a buffer layer.

The semiconductor device 1 further includes an underlying layer 28 and an insulating layer 29, which are formed on the Group III nitride semiconductor lamination structure 2.

The underlying layer 28 is formed on the entire surface of the Group III nitride semiconductor lamination structure 2 including the formation regions of the drain electrode 3 and the source electrode 5. For example, the underlying layer 28 may be formed of an SiN film and the thickness of the underlying layer 28 may be 5 nm to 200 nm.

The insulating layer 29 covers the underlying layer 28 and includes a first layer 30 and a second layer 31 formed on the first layer 30. For example, the first layer 30 and the second layer 31 may be formed of a $SiO_2$ film. Furthermore, the insulating layer 29 may have a thickness of 1.5 μm to 2 μm.

Individually, the first layer 30 may have a thickness of 500 nm to 1,000 nm and the second layer 31 may have a thickness of 500 nm to 1,000 nm.

A gate opening portion 32 extending to the Group III nitride semiconductor lamination structure 2 is formed in the first layer 30 and the underlying layer 28. The oxide film 27 is exposed on a bottom portion of the gate opening portion 32. A gate insulating film 33 is formed so as to cover a bottom portion and a side portion of the gate opening portion 32. The gate insulating film 33 is also formed between the first layer 30 and the second layer 31 in addition to the inside of the gate opening portion 32. For example, the gate insulating film 33 may be formed of a film made of at least one kind of material selected from a group consisting of Si, Al and Hf as a constituent element. More specifically, the gate insulating film 33 may be formed of a film made of at least one kind of material selected from a group consisting of $SiN$, $SiO_2$, $SiON$, $Al_2O_3$, $AlN$, $AlON$, $HiSiO$ and $HfO_2$. Among them, the $Al_2O_3$ film is preferred in some embodiments. Further, the gate insulating film 33 may have a thickness of 10 nm to 100 nm, The gate electrode 4 is embedded in the gate opening portion 32. For example, the gate electrode 4 may be filled in the gate opening portion 32 so as not to protrude upward beyond the opening end of the gate opening portion 32. Alternatively, as indicated by a broken line in FIG. 3, the gate electrode 4 may include an overlap portion 34 formed on the gate insulating film 33 at the peripheral edge of the gate opening portion 32. For example, the gate electrode 4 may be formed of a metal electrode made of Mo, Ni or the like, or may be formed of a semiconductor electrode made of doped polysilicon or the like. The metal electrode is inferior in filling property to the polysilicon electrode; accordingly, in the case of using the metal electrode, the overlap portion 34 is easily formed.

The source field plate 8 and the floating plate 9 are disposed at the lateral side of the gate electrode 4 so as to partially form the side portion of the gate opening portion 32. Specifically, the source field plate 8 and the floating plate 9 are formed on the underlying layer 28 through an insulating film 36 so as to be exposed at the lower side of the side portions of the gate opening portion 32. That is to say, the side portions of the gate opening portion 32 include conductive layer/insulating layer lamination interfaces such that the lower side of the side portions of the gate opening portion 32 is formed by the source field plate 8 and the floating plate 9 and the upper side of the side portions of the gate opening portion 32 is formed by the insulating layer 29 (the first layer 30).

Insulating sidewalls 35 are formed in the side portions of the gate opening portion 32 so as to make contact with the source field plate 8 and the floating plate 9. That is to say, the sidewalls 35 are disposed between the side portions of the gate opening portion 32 and the gate insulating film 33. For example, the sidewall 35 may be formed of a film made of at least one kind of material selected from a group consisting of $SiO_2$, SiN and SiON. Among them, the $SiO_2$ film is preferred in some embodiments. Further, the sidewall 35 may have a thickness of 10 nm to 200 nm.

The source field plate 8 and the floating plate 9 are insulated from the gate electrode 4 by the sidewalls 35 and the gate insulating film 33. For example, a distance $L_{GF}$ between the gate electrode 4 and the source field plate 8 or between the gate electrode 4 and the floating plate 9 may be 1 μm or less, preferably 50 nm to 200 nm in some embodiments. In the present embodiment, the distance $L_{GF}$ is defined by the total thickness of the gate insulating film 33 and the sidewall 35 and in a configuration not including the sidewalls 35, the distance $L_{GF}$ may be equal to the thickness of the gate insulating film 33. Further, the length $L_{FP}$ of the source field plate 8, for example, satisfies an inequality $L_{FP} < \frac{1}{3} L_{GD}$ where $L_{GD}$ denotes the distance between the gate electrode 4 and the drain electrode 3. For example, in the case where the withstand voltage of the semiconductor device 1 is 200 V or less, the length $L_{FP}$ may be 0.25 μm to 1.5 μm and the distance $L_{GD}$ may be 1 μto 6 μm. Further, the source field plate 8 and the floating plate 9 may be formed of a Mo film and the thickness thereof may be 10 nm to 200 nm.

A source contact hole 37 and a drain contact hole 38, both of which extend to the Group III nitride semiconductor lamination structure 2, are formed in the insulating layer 29 and the underlying layer 28. The source contact hole 37 and the drain contact hole 38 are formed in positions transversely spaced apart from the gate opening portion 32. The source electrode 5 and the drain electrode 3 are embedded in the source contact hole 37 and the drain contact hole 38, respectively. The source electrode 5 and the drain electrode 3 are electrically connected to the Group III nitride semiconductor lamination structure 2 within the source contact hole 37 and the drain contact hole 38, respectively.

The source contact hole 37 and the drain contact hole 38 include ohmic contact openings 39 and 40 larger in the region of the underlying layer 28 than in the region of the insulating layer 29 (see FIGS. 1A, 1B and 3 for the ohmic contact opening 39; and see FIGS. 1A and 1B for the ohmic contact opening 40). The source electrode 5 and the drain electrode 3 include ohmic electrodes 41 and 42 disposed in the ohmic contact openings 39 and 40, respectively, and the source electrode 5 and the drain electrode 3 include pad electrodes 43 and 44 disposed in the insulating layer 29, respectively. As illustrated in FIGS. 1A and 1B, the end portions of the ohmic electrodes 41 and 42 in the depth direction of the space 15 are disposed in the same position; however, for example, the end portion of the ohmic electrode 42 existing at the drain side may be selectively disposed backward. The pad electrodes 43 and 44 are formed on the ohmic electrodes 41 and 42 and the top portions of the pad electrodes 43 and 44 are exposed from the surface of the insulating layer 29. For example, the ohmic electrodes 41 and 42 and the pad electrodes 43 and 44 may be formed of a Ti/Al film.

In the present embodiment, a contact hole 46 extending to the source field plate 8 may be formed in the insulating layer 29 although this configuration appears in a cross section taken in a position differing from the position illustrated in FIG. 3. The source contact 23 illustrated in FIGS. 1A and 1B may be embedded in the contact hole 46 and may be connected to the source field plate 8.

In this semiconductor device 1, as described above, the electron supply layer 25 differing in Al composition from the electron channel layer 24 is formed on the electron channel layer 24, thereby forming a hetero-junction. Thus, the two-dimensional electron gas 26 is formed within the electron channel layer 24 existing near the interface between the electron channel layer 24 and the electron supply layer 25 and an HEMT using the two-dimensional electron gas 26 as a channel is formed. The gate electrode 4 faces the electron channel layer 24 with the lamination film of the oxide film 27 and the gate insulating film 33 interposed therebetween. The electron supply layer 25 does not exist immediately below the gate electrode 4. Accordingly, the two-dimensional electron gas 26 otherwise caused by the polarization attributable to the lattice mismatch between the electron supply layer 25 and the electron channel layer 24 is not formed immediately below the gate electrode 4. Thus, when a bias is not applied to the gate electrode 4 (during a zero bias time), the channel formed by the two-dimensional electron gas 26 is cut off immediately below the gate electrode 4. Consequently, a normally-off-type HEMT is realized. If an appropriate on-voltage (e.g., 5 V) is applied to the gate electrode 4, a channel is induced within the electron channel layer 24 existing immediately below the gate electrode 4 and the two-dimensional electron gas 26 existing at the opposite sides of the gate electrode 4 are connected to each other. Thus, the source and the drain are conducted.

When in use, for example, a predetermined voltage (e.g., 200 V to 400 V) which makes the side of the drain electrode 3 positive is applied between the source electrode 5 and the drain electrode 3. In this state, an off-voltage (0 V) or an on-voltage (5 V) is applied to the gate electrode 4 using the source electrode 5 as a reference potential (0 V).

The interface between the oxide film 27 and the electron channel layer 24 is contiguous to the interface between the electron supply layer 25 and the electron channel layer 24. Accordingly, the state of the interface of the electron channel layer 24 existing immediately below the gate electrode 4 is the same as the state of the interface between the electron supply layer 25 and the electron channel layer 24. Thus, the electron mobility in the electron channel layer 24 existing immediately below the gate electrode 4 is kept high. In this way, the present embodiment provides a nitride semiconductor device having a normally-off-type HEMT structure.

Next, a method of manufacturing the semiconductor device 1 will be described with reference to FIGS. 4 and 5A to 5O.

Figure 4:
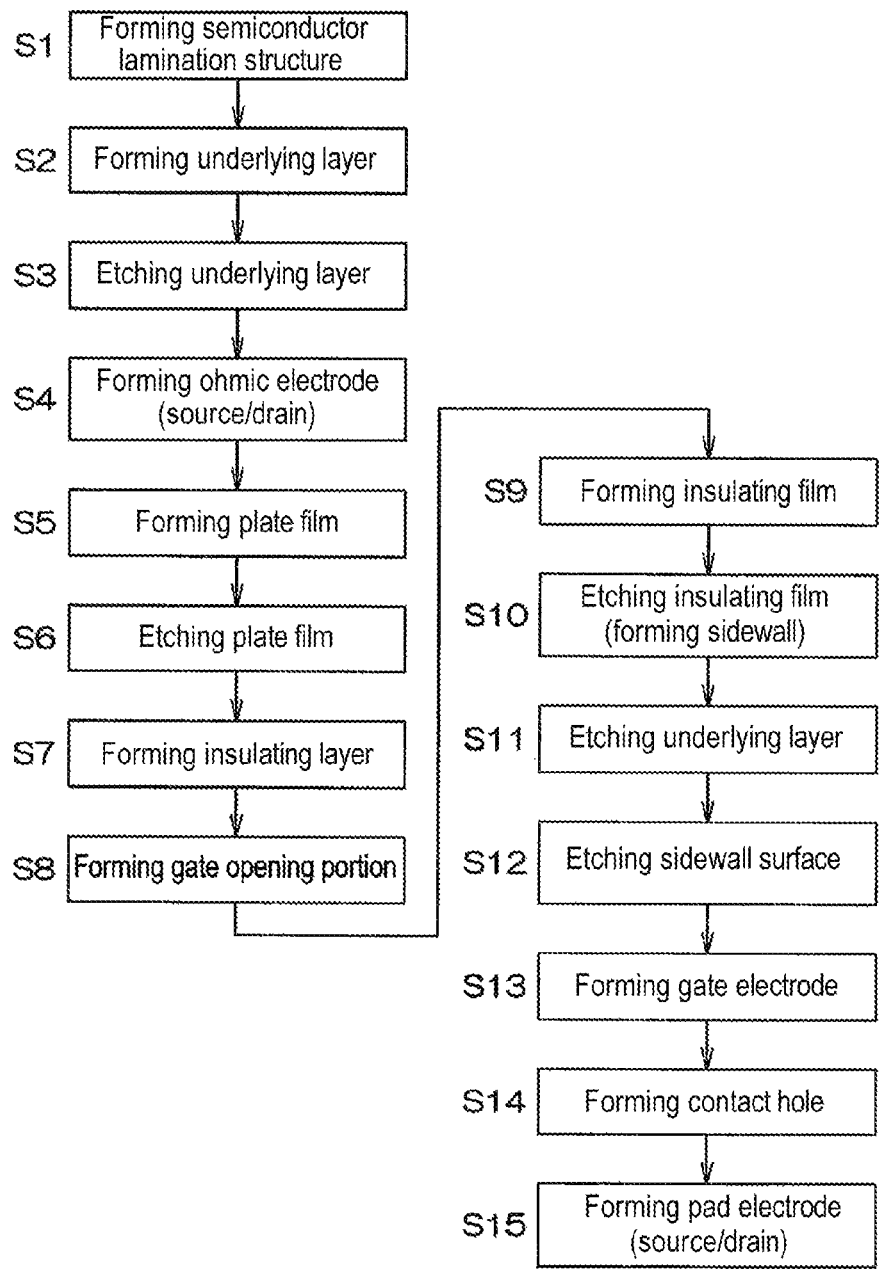
FIG. 4 is a flowchart for explaining a method of manufacturing the semiconductor device.

FIG. 4 is a flowchart explaining a method of manufacturing the semiconductor device 1. FIGS. 5A to 5O are views illustrating a manufacturing process of the semiconductor device 1 in the order of steps.

In order to manufacture the semiconductor device 1, for example, a buffer layer (not illustrated) and the electron channel layer 24 are caused to epitaxially grow one after another on a substrate (not illustrated). As illustrated in FIG. 5A, the electron supply layer 25 is further caused to epitaxially grow on the electron channel layer 24. Thus, the Group III nitride semiconductor lamination structure 2 is formed (Step S1).

Then, as illustrated in FIG. 5B, the underlying layer 28 is formed by, for example, a CVD method (chemical vapor deposition method) so as to cover the entire surface of the electron supply layer 25 (Step S2).

Then, as illustrated in FIG. 5C, the underlying layer 28 is selectively removed by, for example, dry etching (Step S3). Thus, the ohmic contact opening 39 of the source contact hole 37 and the ohmic contact opening 40 of the drain contact hole 38 are formed at the same time (In FIG. 5C and the subsequent figures, the drain contact hole 38 is not shown with the descriptions thereof omitted).

Figure 5D:
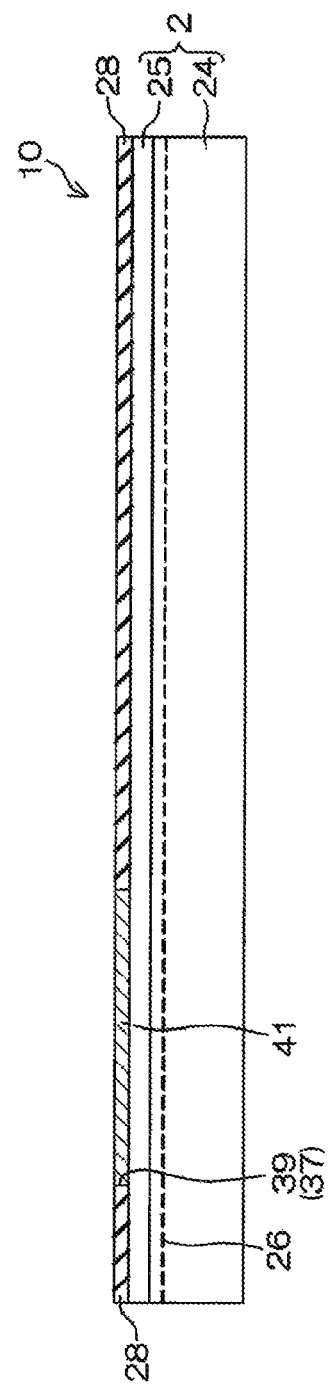
FIG. 5D is a view illustrating the next step of the step illustrated in FIG. 5C.

Then, as illustrated in FIG. 5D, the ohmic electrode 41 is formed in the ohmic contact opening 39 (Step S4). As illustrated in FIG. 5C, when forming the ohmic contact opening 39, it is only necessary to etch the underlying layer 28 which is a film thinner than the insulating layer 29 to be formed in the subsequent step. Therefore, as compared with a case where an opening is formed by etching the insulating layer 29, it is possible to reduce damage of the surface of the Group III nitride semiconductor lamination structure 2. As a result, the ohmic electrode 41 (source electrode 5) can be connected to the surface of the Group III nitride semiconductor lamination structure 2 with reduced damage; accordingly, it is possible to obtain a good ohmic contact.

Then, as illustrated in FIG. 5E, the insulating film 36 is formed by, for example, a CVD method (chemical vapor deposition method) so as to cover the entire surface above the electron supply layer 25. Furthermore, the plate film 45 as one example of a conductive layer of the present disclosure is formed on the insulating film 36 by a sputtering method, a deposition method or the like (Step S5).

Then, as illustrated in FIG. 5F, the plate film 45 is selectively removed by, for example, dry etching (Step S6). Thus, plate films 6 are formed between the formation region of the source electrode 5 and the formation region of the drain electrode 3. The distance between the adjoining plate films 6 is at least larger than the opening diameter of the source contact hole 37 to be formed at a subsequent step and preferably in some embodiments, as illustrated in FIG. 5F, the distance between the adjoining plate films 6 is larger than the opening diameter of the ohmic contact opening 39. By doing so, even if the source contact hole 37 is transversely shifted in the course of forming the source contact hole 37, it is possible to prevent the contact of the source electrode 5 and the plate films 6. That is to say, the source electrode 5 is prevented from being connected to the plate films 6 in a region other than the source contact 23.

Figure 5G:
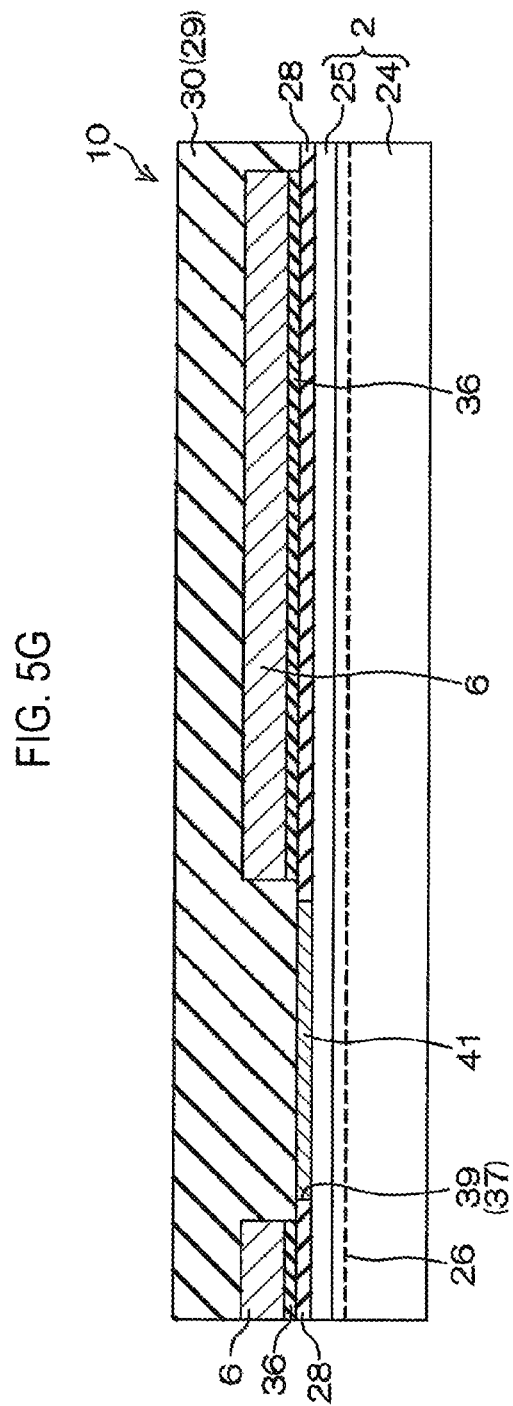
FIG. 5G is a view illustrating the next step of the step illustrated in FIG. 5F.

Then, as illustrated in FIG. 5G, the first layer 30 of the insulating layer 29 is formed by, for example, a CVD method (chemical vapor deposition method) so as to cover the entire surface above the electron supply layer 25 (Step S7). Thus, the plate film 6 is embedded in the first layer 30.

Then, as illustrated in FIG. 5H, the gate opening portion 32 is formed by etching the first layer 30 and the plate films 6 from an etching region including a region which faces the plate films 6 (Step S8). Thus, the plate films 6 are separated into the drain-side source field plate 8 and the source-side floating plate 9 in a self-aligned manner with respect to the gate opening portion 32. Accordingly, at this step, the source field plate 8 and the floating plate 9 are exposed toward the side portions of the gate opening portion 32.

Figure 5I:
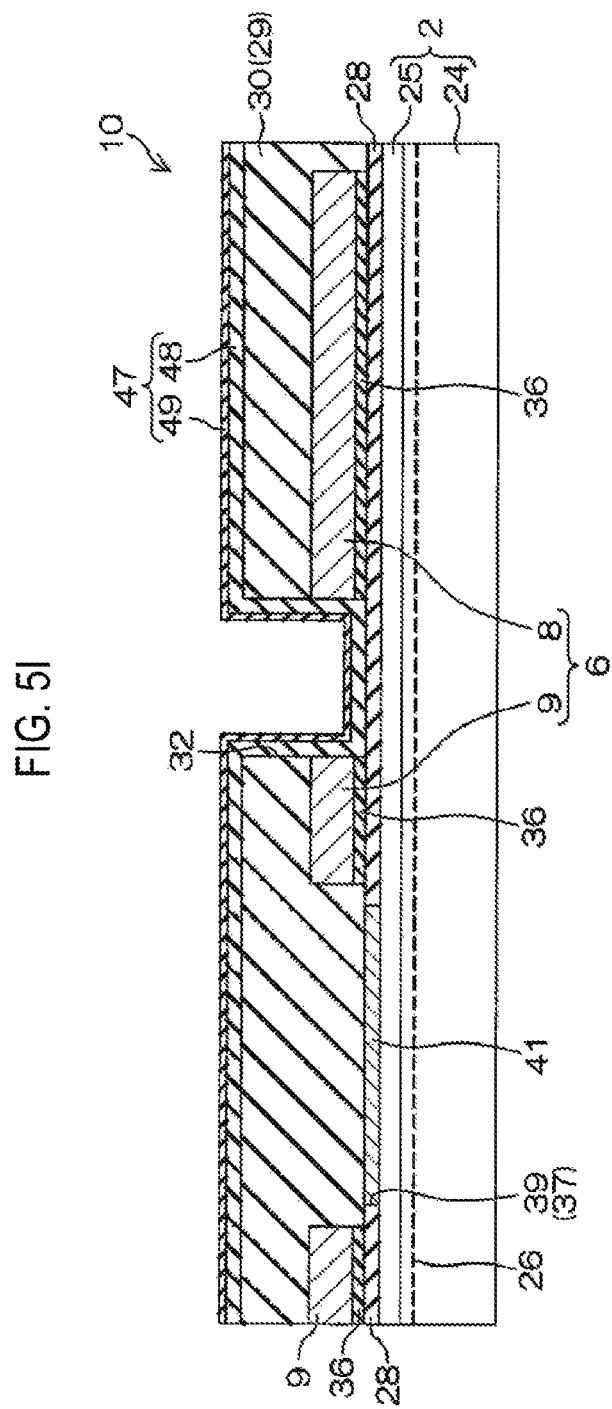
FIG. 5I is a view illustrating the next step of the step illustrated in FIG. 5H.

Then, as illustrated in FIG. 5I, the insulating film 47 is formed by, for example, a CVD method (chemical vapor deposition method) so as to cover the entire surface above the electron supply layer 25 (Step S9). The step of forming the insulating film 47 may include a step of forming the lower layer film 48 which makes contact with the insulating layer 29 and a step of forming the upper layer film 49 which forms an uppermost surface of the insulating film 47; accordingly, the step of forming the insulating film 47 may include a step of forming an insulating film lamination structure. The lamination structure may be formed of a two-layer structure or may be formed of a structure having three or more layers. For example, the lower layer film 48 may be formed of a $SiO_2$ film and the upper layer film 49 may be formed of an $Al_2O_3$ film. If both the insulating layer 29 and the lower layer film 48 are $SiO_2$ films, it is possible to increase the adhesion of the insulating film 47 (the lower layer film 48) with respect to the insulating layer 29. Thus, at the subsequent step, it is possible to prevent peeling of the sidewalls 35.

Figure 5J:
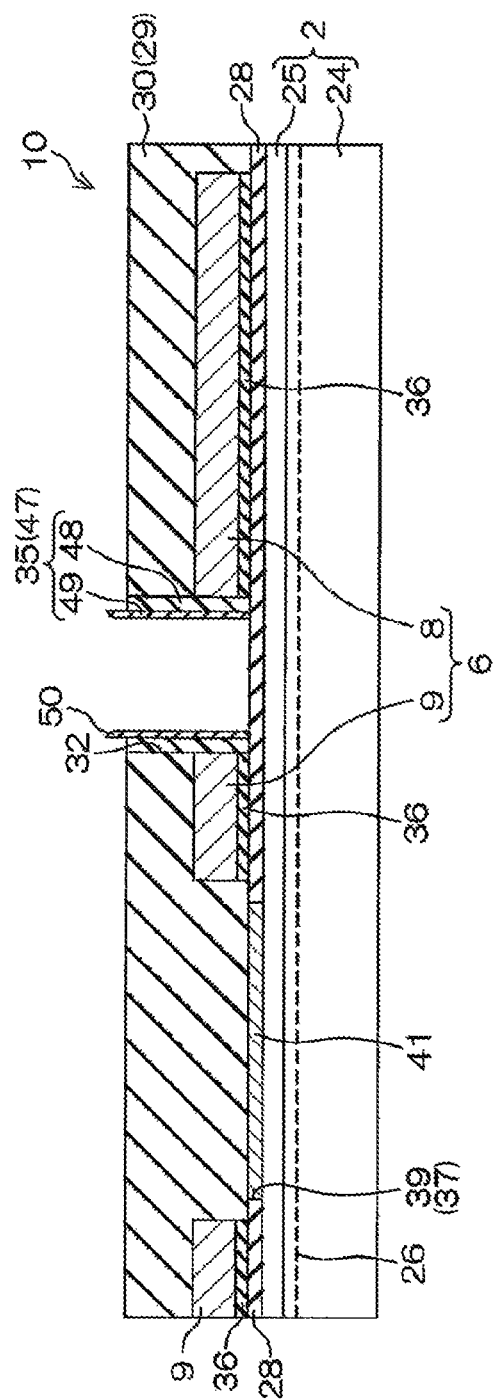
FIG. 5J is a view illustrating the next step of the step illustrated in FIG. 5I.

Then, as illustrated in FIG. 5J, the portion of the insulating film 47 existing on the insulating layer 29 is selectively removed by, for example, etching, and the sidewalls 35 are formed in the side portions of the gate opening portion 32 (Step S10). If an $Al_2O_3$ film is employed as the upper layer film 49, it is sometimes the case that after the etching, a portion of the hard-to-etch $Al_2O_3$ film remains as a protrusion portion 50 protruding upward from the gate opening portion 32.

Then, as illustrated in FIG. 5K, the underlying layer 28 existing in the bottom portion of the gate opening portion 32 is selectively removed by, for example, dry etching (Step S11). Thus, the electron supply layer 25 of the Group III nitride semiconductor lamination structure 2 is exposed in the bottom portion of the gate opening portion 32. If the underlying layer 28 is a SiN film and if the upper layer film 49 is an $Al_2O_3$ film, it is possible to reduce the etching selectivity of the upper layer film 49 with respect to the etchant (e.g., a $CF_4$ gas or the like) for the underlying layer 28. Accordingly, when etching the underlying layer 28, it is possible to protect the lower layer film 48 with the upper layer film 49; and this makes it possible to restrain the sidewalls 35 (the lower layer film 48) from being etched together with the underlying layer 28 and becoming thinner. Thus, even after etching the underlying layer 28, it is possible to maintain the sidewalls 35 having a thickness close to a designed value.

Figure 5L:
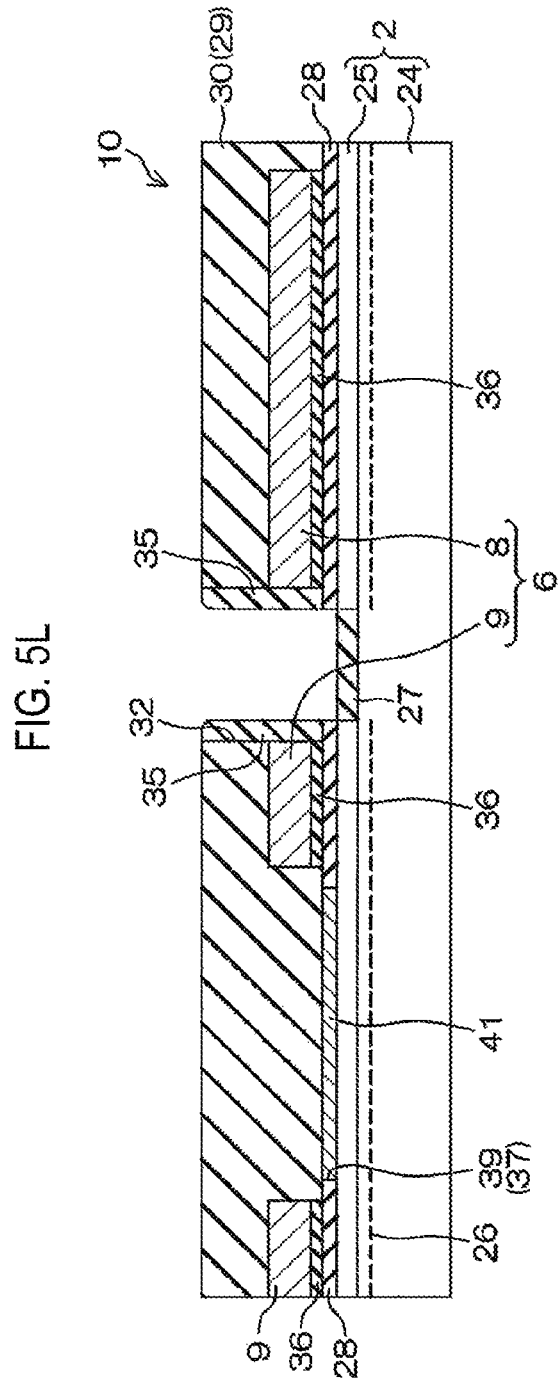
FIG. 5L is a view illustrating the next step of the step illustrated in FIG. 5K.

Then, as illustrated in FIG. 5L, the surface portions of the sidewalls 35 are selectively etched by, for example, dry etching (Step S12). In the present embodiment, the upper layer film 49 which forms the outermost surfaces of the sidewalls 35 are selectively removed; accordingly, the lower layer film 48 remains as the sidewalls 35. In the case where the upper layer film 49 is an $Al_2O_3$ film, for example, a $BCl_3$ gas may be used as an etchant. Thereafter, the portion of the electron supply layer 25 exposed to the gate opening portion 32 is selectively oxidized; accordingly, a portion of the electron supply layer 25 becomes the oxide film 27.

Figure 5M:
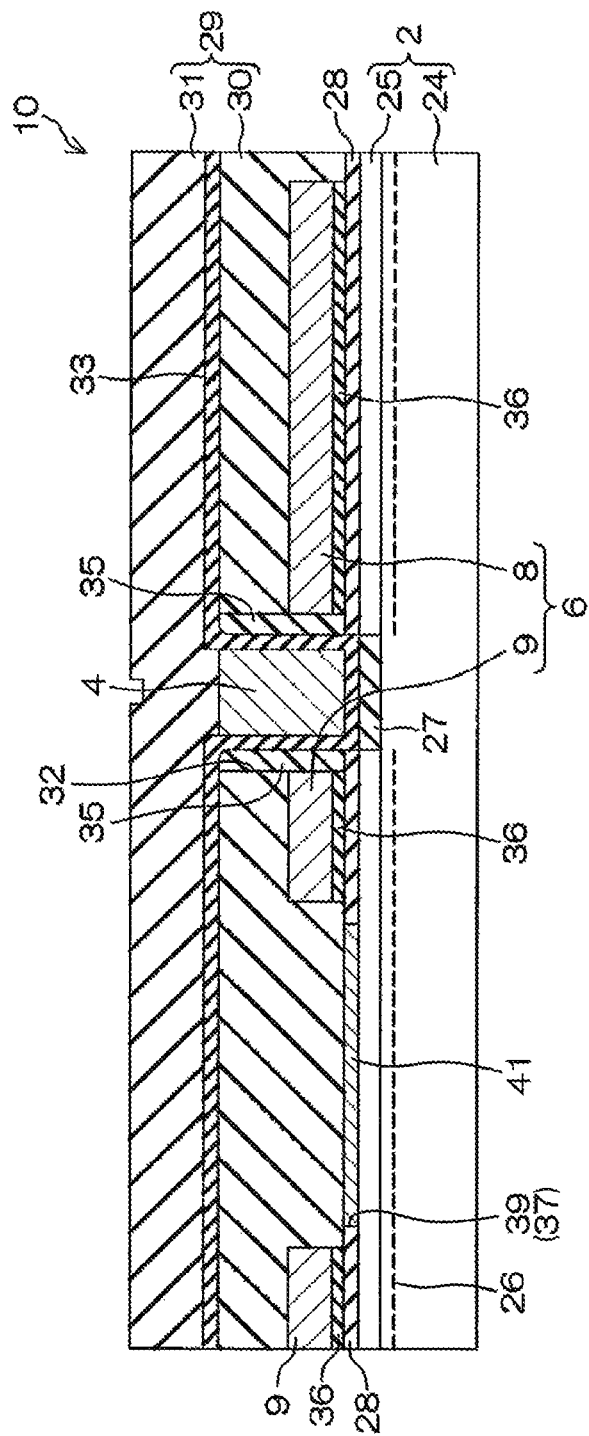
FIG. 5M is a view illustrating the next step of the step illustrated in FIG. 5L.

Then, as illustrated in FIG. 5M, the gate insulating film 33 is formed by, for example, a CVD method (chemical vapor deposition method) so as to cover the entire surface above the electron supply layer 25 and, furthermore, the gate electrode 4 is embedded inside the gate insulating film 33 (Step S13). After forming the gate electrode 4, the second layer 31 is formed by, for example, a CVD method (chemical vapor deposition method) so as to cover the entire surface above the electron supply layer 25.

Figure 5N:
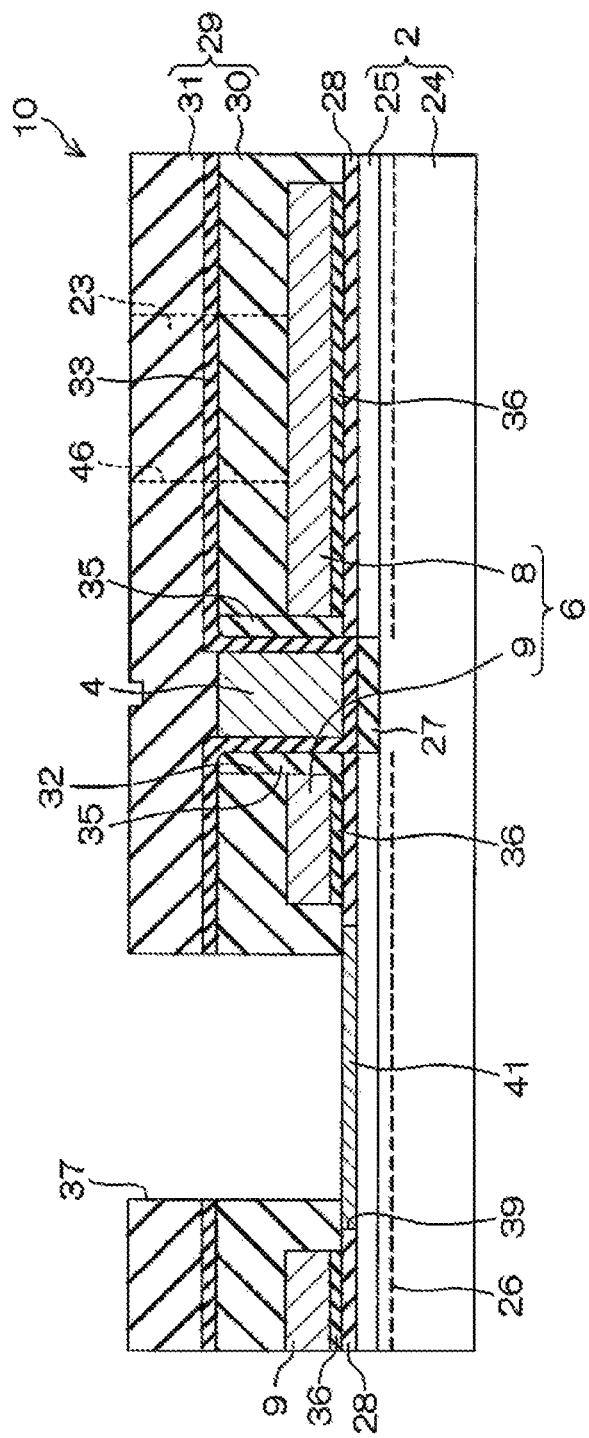
FIG. 5N is a view illustrating the next step of the step illustrated in FIG. 5M.
Figure 50:
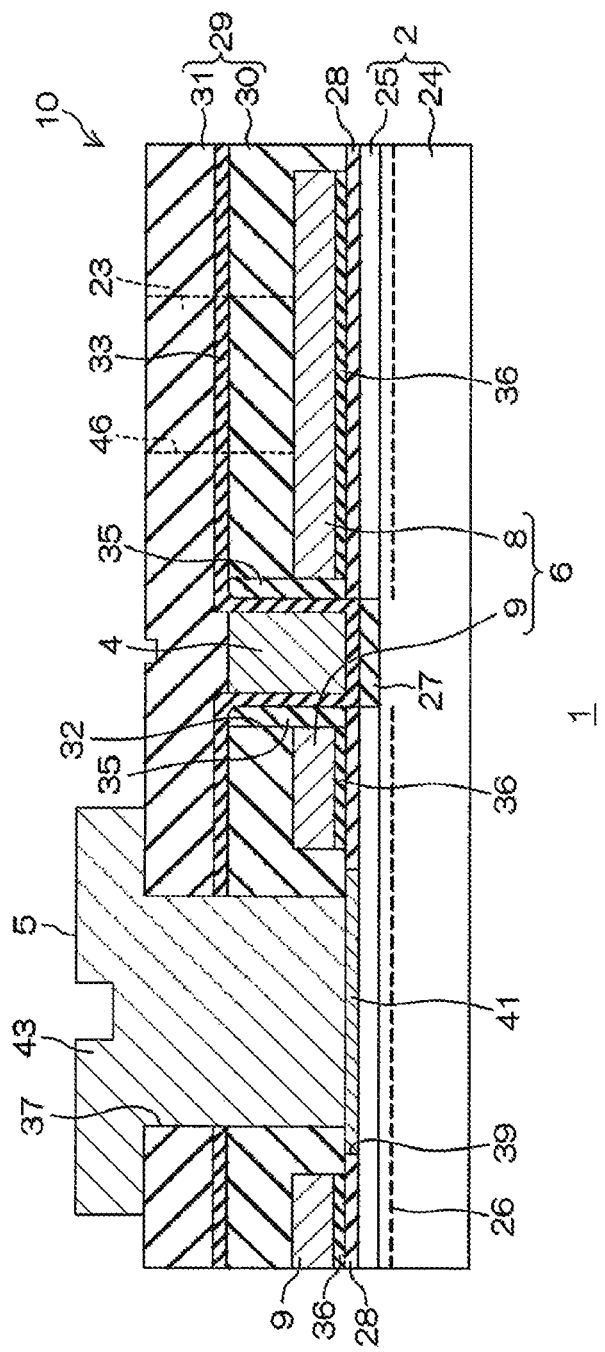

Then, as illustrated in FIG. 5N, the second layer 31, the gate insulating film 33 and the first layer 30 are selectively removed from an etching region including a region facing toward the ohmic electrode 41 and the source field plate 8 by, for example, dry etching. Thus, the source contact hole 37, the drain contact hole 38 (see FIGS. 1A, 1B and 2) and the contact hole 46 are formed at the same time (Step S14).

Then, as illustrated in FIG. 5O, an electrode film is formed on the insulating layer 29 by, for example, a sputtering method, a deposition method or the like so as to cover the entire surface above the electron supply layer 25 and the source electrode 5 (pad electrode 43), the drain electrode 3 (pad electrode 44) and the source contact 23 are formed by patterning the electrode film (Step S15). By way of the steps described above, the semiconductor device 1 illustrated in FIGS. 1A to 3 is obtained.

According to the method described above, as illustrated in FIG. 5H, the source field plate 8 is formed through a self-alignment process when forming the gate opening portion 32. Thus, the source field plate 8 is exposed to the side portion of the gate opening portion 32; and it is therefore possible to fix the end portion of the source field plate 8 that is close to the gate electrode 4 to the side portion of the gate opening portion 32. Therefore, as illustrated in FIG. 3, the distance $L_{GF}$ between the gate electrode 4 and the source field plate 8 can be easily controlled by the gate insulating film 33 and the sidewalls 35. As a result, it is possible to design the maximum field intensity in the semiconductor device 1 at an intended value. Accordingly, it is possible to realize a structure capable of relaxing electric field concentration on the respective end portions of the gate electrode 4 and the source field plate 8.

Figure 7:
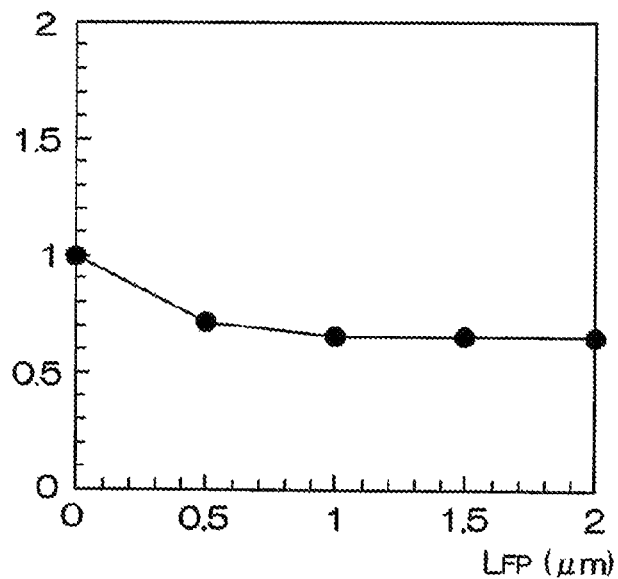
FIG. 7 is a graph representing a relationship between $L_{fp}$ and maximum field intensity in the simulation model.
Figure 8:
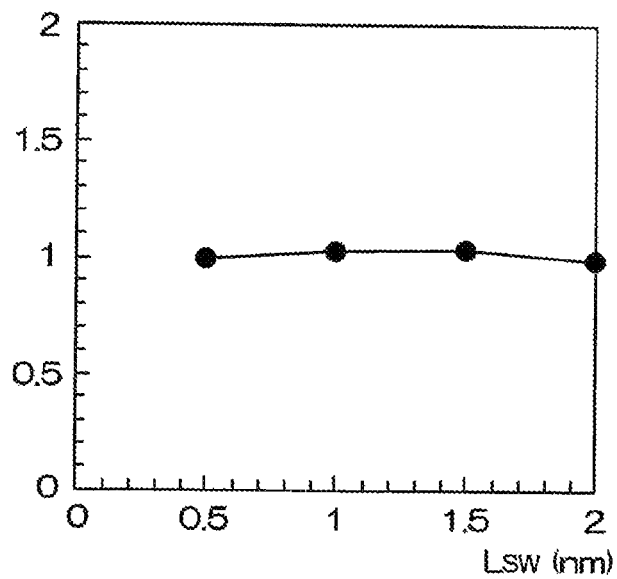
FIG. 8 is a graph representing a relationship between $L_{sw}$ and maximum field intensity in the simulation model.

This effect can be demonstrated by referring to, for example, FIGS. 6 to 8. FIG. 6 is a diagram showing a simulation model.

In this simulation model, the following conditions were set with regard to the major configurations illustrated in FIG. 3.

Group III nitride semiconductor lamination structure 2: GaN (1.0 µm, $1 \times 10^{16}$ $cm^{-3}$)/AlGaN
Underlying layer 28: SiN, 100 nm
Insulating film 36: $Al_2O_3$, 40 nm
Source field plate (SFP) 8: length $L_{FP}$
Insulating layer 29: $SiO_2$, 300 nm
Gate insulating film 33: $Al_2O_3$, 40 nm
Sidewall 35: $SiO_2$, thickness $L_{SW}$
Under these conditions, a simulation was conducted to know how the field intensity concentration is changed when changing the length $L_{FP}$ of the source field plate 8 and the thickness $L_{SW}$ of the sidewall 35 ($L_{GD}$=6.0 µm, $V_{DS}$=200 V). The results are shown in FIGS. 7 and 8.

FIG. 7 is a graph representing a relationship between $L_{FP}$ and maximum field intensity in the simulation model. In FIG. 7, the measured values are standardized by assuming that the value available when $L_{FP}$ is equal to 0 µm (namely, when the source field plate 8 does not exist) is 1. According to FIG. 7, it can be noted that the maximum field intensity can be relaxed by installing the source field plate 8. Since the field relaxing effect is saturated when $L_{FP}$>1 µm (=⅙$L_{GD}$), in view of the increase in the drain-source coupling capacitance Cds associated with the increase in the length $L_{FP}$, it is preferred that the length $L_{FP}$ is at least about less than ⅓ of the distance $L_{GD}$.

FIG. 8 is a graph representing a relationship between $L_{SW}$ and maximum field intensity in the simulation model. In FIG. 8, the measured values are standardized by assuming that the value available when $L_{SW}$ is equal to 50 µm is 1. According to FIG. 8, it can be noted that the maximum field intensity does not depend on the thickness $L_{SW}$ of the sidewall 35. In other words, FIG. 8 indicates that the distance $L_{GF}$ between the gate electrode 4 and the source field plate 8 illustrated in FIG. 3, whether small or large, has a low influence on the maximum field intensity. Thus, if the source field plate 8 is disposed relatively close to the gate electrode 4 (e.g., 1 µm or less) by adjusting the thickness of the gate insulating film 33 and the sidewall 35, it is possible to reliably relax the electric field concentration on the end portion of the source field plate 8.

Moreover, the spread of a channel of the Group III nitride semiconductor lamination structure 2 was verified using the model shown in FIG. 6. FIGS. 9A to 9C and FIGS. 10A to 10C are views illustrating the spread of a channel in the simulation model (without an SFP). FIGS. 11A to 11C and FIGS. 12A to 12C are views illustrating the spread of a channel in the simulation model (with an SFP).

As can be seen from FIGS. 11A to 11C and FIGS. 12A to 12C, in a normally-off-type GaN-HEMT using an MIS structure just like the semiconductor device 1, there is obtained a result that if the source field plate 8 exists, carriers generated by a gate voltage are not spread to a region existing immediately below the source field plate 8. In this case, for example, if an oxide film region is formed immediately below the source field plate 8 such that carriers of a two-dimensional electron gas 26 do not exist in this oxide film region, there may be a case where a potential grows higher in the oxide film region existing immediately below the source field plate 8. For that reason, when a relatively high bias is not applied to the gate electrode 4, the potential is not lowered; and thus, there is a possibility that an electric current does not flow between the source and the drain. Thus, in the present embodiment, as illustrated in FIG. 5H, the source field plate 8 is formed through a self-alignment process when forming the gate opening portion 32. For that reason, the oxide film 27 is not formed immediately below the source field plate 8. Accordingly, a channel can be formed with a relatively low gate voltage by setting the distance $L_{GF}$ between the gate electrode 4 and the source field plate 8 as small as possible; and this makes it possible to derive an on-characteristic of a device to a maximum extent. Moreover, this structure can be realized by a simple method of adjusting the thickness of the gate insulating film 33 and the sidewall 35. Furthermore, according to the present embodiment, due to the provision of the sidewall 35, the distance $L_{GF}$ between the gate electrode 4 and the source field plate 8 can be controlled mainly by the thickness of the sidewall 35. Thus, it is possible to design the thickness of the gate insulating film 33 mainly in conformity with an intended gate threshold value voltage.

In the semiconductor device 1, the source field plate 8 that is electrically connected to the source electrode 5 is disposed between the gate and the drain. Thus, it is not necessary to install a gate field plate integrally and transversely extending from the gate electrode 4 on the insulating layer 29; accordingly, it is possible to reduce a gate-drain coupling capacitance Cgd. As a result, it is possible to reduce the parasitic capacitance of the semiconductor device 1; and this makes it possible to reliably perform a high-speed switching operation, a high-frequency operation and the like, which are features of a nitride semiconductor-based device. This effect can be demonstrated by, for example, referring to FIG. 13.

Figure 13:
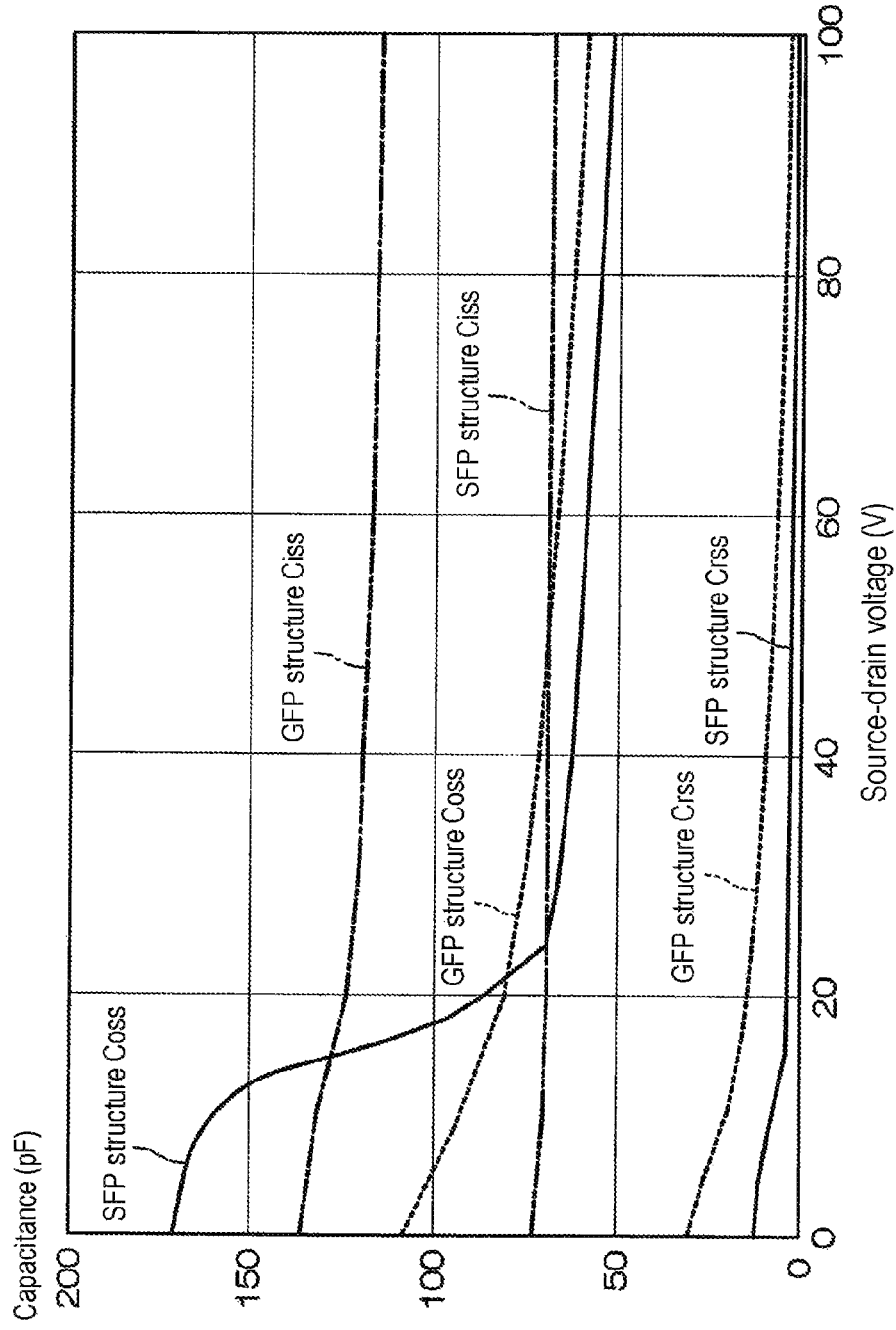
FIG. 13 is a view showing an evaluation result of a parasitic capacitance.

FIG. 13 is a view showing an evaluation result of a parasitic capacitance. In FIG. 13, the solid line indicates a change of the parasitic capacitance of the semiconductor device 1 provided with the source field plate (SFP) 8 and the broken line indicates a change of the parasitic capacitance of a semiconductor device provided with a gate field plate (GFP) instead of the source field plate (SFP) 8.

According to FIG. 13, in the SFP structure, the source field plate 8 of a source potential and the two-dimensional electron gas 26 of a drain potential face each other (see FIG. 3). Thus Coss (=Cds+Cgs) tends to become larger in a low voltage region. However, it can be noted that when the parasitic capacitance including Ciss (=Cgs+Cgd) and Crss (=Cgd) is determined as a whole, the SFP structure can reduce capacitance compared to the GFP structure.

While one embodiment of the present disclosure has been described above, the present disclosure may be embodied in other forms.

Figure 14:
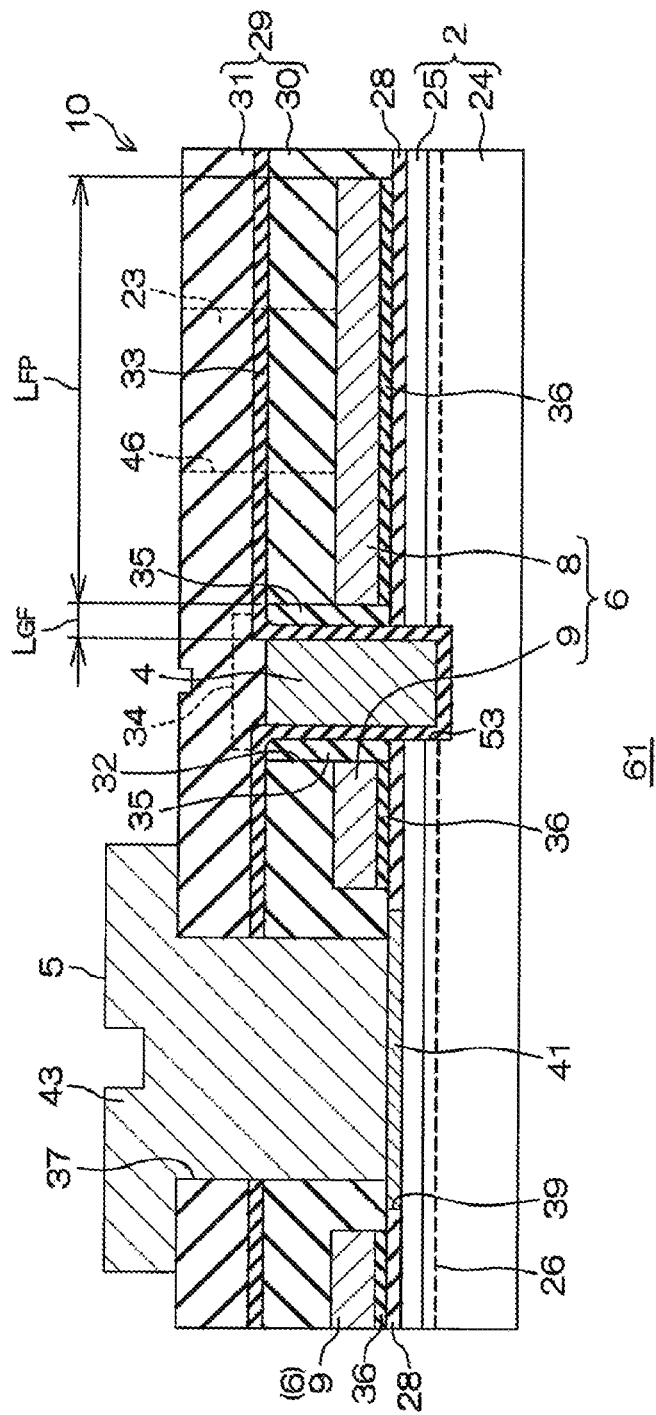
FIG. 14 is a schematic sectional view of a semiconductor device according to one embodiment of the present disclosure.

For example, a semiconductor device 61 illustrated in FIG. 14, which is a structure for realizing a normally-off-type HEMT, includes a recess 53 in place of the oxide film 27. The recess 53 may be formed to extend to the surface layer portion of the electron channel layer 24 through the electron supply layer 25 by, for example, selectively etching only the bottom portion of the gate opening portion 32. The recess 53 prevents formation of a hetero-junction of the electron channel layer 24 and the electron supply layer 25 in a region immediately below the gate electrode 4. Thus, when a gate bias is not applied (during a zero bias time), the two-dimensional electron gas 26 is not formed in the region immediately below the gate electrode 4. It is therefore possible to realize a normally-off-type HEMT.

Furthermore, the semiconductor device 1 may not include the sidewall 35. In this case, the distance $L_{GF}$ between the gate electrode 4 and the source field plate 8 can be controlled based on only the thickness of the gate insulating film 33.

Moreover, the semiconductor device 1 may not include the floating plate 9 existing between the source and the gate. That is to say, the field plate (the source field plate 8) may be selectively installed only between the gate and the drain in the two choices of between the source and the gate and between the gate and the drain. In this configuration, for example, when performing the etching illustrated in FIG. 5H, the etching region may be set as a region which spans the inside and outside of the end portion of the plate film 6.

In addition, it is possible to make various design changes within the scope of the subject matters recited in the claims.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a Group III nitride semiconductor lamination structure including a hetero-junction;
   an insulating layer formed on the Group III nitride semiconductor lamination structure, the insulating layer including a gate opening portion extending to the Group III nitride semiconductor lamination structure;
   a gate insulating film configured to cover a bottom portion and a side portion of the gate opening portion;
   a gate electrode formed on the gate insulating film in the gate opening portion;
   a source electrode and a drain electrode disposed in a spaced-apart relationship with the gate electrode to sandwich the gate electrode and electrically connected to the Group III nitride semiconductor lamination structure; and
   a conductive layer embedded in the insulating layer between the gate electrode and the drain electrode and insulated from the gate electrode by the gate insulating film, the conductive layer electrically connected to the source electrode.

2. The semiconductor device of claim 1, further comprising:
   an insulating sidewall disposed between the gate insulating film and the side portion of the gate opening portion.

3. The semiconductor device of claim 2, wherein the sidewall includes at least one kind of material selected from a group consisting of $SiO_2$, SiN and SiON.

4. The semiconductor device of claim 1, wherein a distance $L_{GF}$ between the gate electrode and the conductive layer is 1 μor less.

5. The semiconductor device of claim 1, wherein a length $L_{FP}$ of the conductive layer and a distance $L_{GD}$ between the gate electrode and the drain electrode satisfy an inequality of $L_{FP} < \frac{1}{3} L_{GD}$.

6. The semiconductor device of claim 1, wherein the gate insulating film includes, as a constituent element, at least one kind of material selected from a group consisting of Si, Al and Hf.

7. The semiconductor device of claim 1, wherein the gate electrode includes a metal electrode.

8. The semiconductor device of claim 1, wherein the gate electrode includes an overlap portion formed on the gate insulating film at a peripheral edge of the gate opening portion.

9. The semiconductor device of claim 1, wherein the Group III nitride semiconductor lamination structure includes an active region including an element structure formed by sandwiching the gate electrode with the source electrode and the drain electrode and a non-active region other than the active region,
 each of the source electrode and the conductive layer includes an extension portion extending to the non-active region, and
 the extension portion of the source electrode and the extension portion of the conductive layer are connected to each other.

10. The semiconductor device of claim 1, wherein the Group III nitride semiconductor lamination structure includes a first semiconductor layer forming the hetero-junction and a second semiconductor layer formed on the first semiconductor layer, and
 the second semiconductor layer includes an oxide film selectively formed in the bottom portion of the gate opening portion by oxidizing the second semiconductor layer.

11. The semiconductor device of claim 1, wherein the Group III nitride semiconductor lamination structure includes a first semiconductor layer forming the hetero-junction and a second semiconductor layer formed on the first semiconductor layer, and
 the second semiconductor layer is selectively etched only in the bottom portion of the gate opening portion.

12. The semiconductor device of claim 1, further comprising:
 an underlying layer that is disposed between the conductive layer and the Group III nitride semiconductor lamination structure and extends to formation regions of the source electrode and the drain electrode,
 wherein at least one of the source electrode and the drain electrode includes an ohmic electrode disposed in the underlying layer and a pad electrode in the insulating layer formed on the ohmic electrode.

13. The semiconductor device of claim 12, wherein the underlying layer has a thickness of 5 nm to 200 nm and the insulating layer has a thickness of 1.5 μm to 2 μm.

14. The semiconductor device of claim 1, further comprising:
 a second conductive layer embedded in the insulating layer between the gate electrode and the source electrode, the second conductive layer insulated from the gate electrode by the gate insulating film and also insulated from the source electrode.

15. A semiconductor device, comprising:
 a Group III nitride semiconductor lamination structure including a hetero-junction;
 an insulating layer formed on the Group III nitride semiconductor lamination structure, the insulating layer including a gate opening portion extending to the Group III nitride semiconductor lamination structure;
 a gate insulating film configured to cover a bottom portion and a side portion of the gate opening portion;
 a gate electrode formed on the gate insulating film in the gate opening portion;
 a source electrode and a drain electrode disposed in a spaced-apart relationship with the gate electrode to sandwich the gate electrode and electrically connected to the Group III nitride semiconductor lamination structure; and
 a source field plate embedded in the insulating layer to partially form the side portion of the gate opening portion between the gate electrode and the drain electrode and insulated from the gate electrode by the gate insulating film, the source field plate electrically connected to the source electrode.

16. The semiconductor device of claim 15, further comprising:
 an insulating sidewall formed in the side portion of the gate opening portion to make contact with the source field plate,
 wherein the gate insulating film is formed to cover the sidewall.

* * * * *